(12) United States Patent
Lee

(10) Patent No.: US 12,402,426 B2
(45) Date of Patent: Aug. 26, 2025

(54) SINGLE-PHOTON DETECTION DEVICE, SINGLE-PHOTON DETECTOR, AND SINGLE-PHOTON DETECTOR ARRAY

(71) Applicant: KOREA INSTITUTE OF SCIENCE AND TECHNOLOGY, Seoul (KR)

(72) Inventor: Myung-Jae Lee, Seoul (KR)

(73) Assignee: TRUPIXEL INC., Daejeon (KR)

( * ) Notice: Subject to any disclaimer, the term of this patent is extended or adjusted under 35 U.S.C. 154(b) by 648 days.

(21) Appl. No.: 17/699,042

(22) Filed: Mar. 18, 2022

(65) Prior Publication Data

US 2023/0065873 A1 Mar. 2, 2023

(30) Foreign Application Priority Data

Aug. 31, 2021 (KR) .......... 10-2021-0115811
Oct. 15, 2021 (KR) .......... 10-2021-0137638

(51) Int. Cl.
*H10F 39/00* (2025.01)

(52) U.S. Cl.
CPC ....... *H10F 39/8033* (2025.01); *H10F 39/802* (2025.01); *H10F 39/805* (2025.01); *H10F 39/8063* (2025.01)

(58) Field of Classification Search
CPC ........... H01L 27/1461; H01L 27/14603; H01L 27/1462; H01L 27/14627; H10F 39/8033; H10F 39/802; H10F 39/8063; H10F 39/805

USPC ......................................................... 257/432
See application file for complete search history.

(56) References Cited

U.S. PATENT DOCUMENTS

| | | |
|---|---|---|
| 9,209,320 B1 | 12/2015 | Webster |
| 9,299,732 B2 | 3/2016 | Webster et al. |
| 9,312,401 B2 | 4/2016 | Webster |
| 9,728,667 B1 | 8/2017 | Johnson et al. |
| 10,438,987 B2 | 10/2019 | Mandai et al. |

(Continued)

FOREIGN PATENT DOCUMENTS

| | | |
|---|---|---|
| JP | 2016041746 A | 3/2015 |
| KR | 101666440 B1 | 10/2016 |

(Continued)

OTHER PUBLICATIONS

I. Oshiyama et al., "Near-infrared Sensitivity Enhancement of a Back-illuminated Complementary Mental Oxide Semiconductor Image Sensor with a Pyramid Surface for Diffraction Structure", 2017 IEEE International Electron Devices Meeting (IEDM), Dec. 2017, pp. 16.4.1 ~ 16.4.4.

(Continued)

*Primary Examiner* — Eric W Jones
(74) *Attorney, Agent, or Firm* — Rabin & Berdo, P.C.

(57) ABSTRACT

A single-photon detection device includes a first well having a first conductivity type, a second well provided on the first well and having a second conductivity type that is different from the first conductivity type, a first depletion forming (Continued)

region provided on the second well and having the first conductivity type, a main depletion region provided between the first well and the second well, and a first sub-depletion region provided between the second well and the first depletion forming region, wherein the first well and the first depletion forming region are spaced apart from each other by the second well.

23 Claims, 34 Drawing Sheets

(56) References Cited

U.S. PATENT DOCUMENTS

| | | | |
|---|---|---|---|
| 2009/0315135 A1* | 12/2009 | Finkelstein | H01L 31/107 257/E31.113 |
| 2010/0013458 A1* | 1/2010 | Lany | G01R 19/0092 324/123 R |
| 2010/0019295 A1 | 1/2010 | Henderson et al. | |
| 2012/0261729 A1 | 10/2012 | Finkelstein et al. | |
| 2015/0054111 A1* | 2/2015 | Niclass | H01L 27/1446 257/438 |
| 2015/0200314 A1 | 7/2015 | Webster | |
| 2015/0340391 A1 | 11/2015 | Webster | |
| 2016/0099371 A1 | 4/2016 | Webster | |
| 2017/0186798 A1* | 6/2017 | Yang | H01L 27/14632 |
| 2020/0091208 A1* | 3/2020 | Otake | H01L 27/1463 |
| 2021/0028202 A1* | 1/2021 | Inoue | H01L 27/14643 |
| 2021/0126025 A1* | 4/2021 | Kennedy | H01L 27/1464 |
| 2022/0262970 A1* | 8/2022 | Murakami | H01L 31/035272 |

FOREIGN PATENT DOCUMENTS

| | | |
|---|---|---|
| KR | 1020190049598 A | 5/2019 |
| KR | 1020200110717 A | 9/2020 |

OTHER PUBLICATIONS

Isamu Takai et al., "Single-Photon Avalanche diode with Enhanced NIR-Sensitivity for Automotive LIDAR Systems", Sensors, 16, 459, pp. 1-9, Mar. 30, 2016.
Kai Zang et al., "Enhanced silicon single-photon avalanche diode based on light trapping", 2018 Conference on Lasers and Electro-Optics (CLEO), May 13-18, 2018.
Kai Zang et al., "Silicon single-photon avalanche diodes with nano-structured light trapping", Nature Communications, 3:628, Sep. 20, 2017, pp. 1-6.
Ceccarelli, Francesco, et al; "Recent Advances and Future Perspectives of Single-Photon Avalanche Diodes for Quantum Photonics Applications", Advanced Quantum Technologies 4.2 (first published Dec. 2020): https:doi.org/10.1002/qute.202000102.
International Search Report and Written Opinion of PCT/KR2022/012002 mailed on Nov. 28, 2022.

* cited by examiner

SINGLE-PHOTON DETECTION DEVICE, SINGLE-PHOTON DETECTOR, AND SINGLE-PHOTON DETECTOR ARRAY

CROSS-REFERENCE TO RELATED APPLICATION

This application is based on and claims priority under 35 U.S.C. § 119 to Korean Patent Application No. 10-2021-0115811, filed on Aug. 31, 2021, and Korean Patent Application No. 10-2021-0137638, filed on Oct. 15, 2021, in the Korean Intellectual Property Office, the disclosure of which is incorporated by reference herein in its entirety.

BACKGROUND

1. Field

One or more embodiments relate to a single-photon detection device, a single-photon detector, and a single-photon detector array.

2. Description of the Related Art

An avalanche photodiode (APD) is a solid-state photodetector in which a high bias voltage is applied to a p-n junction to provide a high first stage gain due to avalanche multiplication. When an incident photon with sufficient energy to emit an electron reaches a photodiode, an electron-hole pair (EHP) is generated. A high electric field rapidly accelerates photo-generated electrons toward (+), additional electron-hole pairs are sequentially generated due to impact ionization caused by the accelerated electrons, and then all of the electrons are accelerated toward the (+) node. Likewise, holes are rapidly accelerated toward (−), and the same phenomenon occurs. As this process repeats, avalanche multiplication of photo-generated carriers and an output current occurs. Accordingly, an APD is a semiconductor-based device that operates in a similar manner to that of a photomultiplier tube. A linear-mode APD is an effective amplifier in which a gain may be set by controlling a bias voltage and a gain of tens to thousands may be achieved in a linear mode.

A single-photon avalanche diode (SPAD) is an APD in which a p-n junction is biased above its breakdown voltage to operate in a Geiger mode, so that a single incident photon may trigger an avalanche to generate very large current and thus an easily measurable current pulse may be obtained along with a quenching resistor or circuit. That is, the SPAD operates as a device that generates a large current pulse when compared to a linear-mode APD in which a gain may not be sufficient at a low light intensity. After the avalanche is triggered, the quenching resistor or circuit is used to reduce a bias below the breakdown voltage in order to quench an avalanche process. Once the avalanche process is quenched, the bias voltage is raised again above the breakdown voltage to reset the SPAD for detection of another photon (i.e., known as recharge the SPAD).

An APD or a SPAD may have electrons generated due to surface defects. The electrons generated due to the surface defects may be introduced into the APD or the SPAD, and may be multiplied. Accordingly, a noise signal may be generated.

SUMMARY

One or more embodiments include a photo-detection device having low noise.

One or more embodiments include a photodetector having low noise.

However, the embodiments are examples, and do not limit the scope of the disclosure.

Additional aspects will be set forth in part in the description which follows and, in part, will be apparent from the description, or may be learned by practice of the presented embodiments.

According to one or more embodiments, a single-photon detection device includes a first well having a first conductivity type, a second well provided on the first well and having a second conductivity type that is different from the first conductivity type, a first depletion forming region provided on the second well and having the first conductivity type, a main depletion region provided between the first well and the second well, and a first sub-depletion region provided between the second well and the first depletion forming region, wherein the first well and the first depletion forming region are spaced apart from each other by the second well.

The single-photon detection device may further include a second depletion forming region provided opposite to the second well with the first well therebetween, and a second sub-depletion region provided between the second depletion forming region and the first well, wherein the second depletion forming region has the second conductivity type.

The single-photon detection device may further include a first contact region electrically connected to the first well, wherein the first contact region is spaced apart from the second well and has the first conductivity type, wherein a doping concentration of the first contact region is higher than a doping concentration of the first well.

The single-photon detection device may further include a relaxation region provided between the first contact region and the first well, wherein the relaxation region has the first conductivity type, wherein a doping concentration of the relaxation region is lower than a doping concentration of the first contact region.

The single-photon detection device may further include a second contact region electrically connected to the second well, wherein the second contact region has the second conductivity type, wherein a doping concentration of the second contact region is higher than a doping concentration of the second well.

The second contact region and the first depletion forming region may contact each other.

The second contact region and the first depletion forming region may be spaced apart from each other.

The single-photon detection device may further include a guard ring region provided on a side surface of the second well, wherein the guard ring region has the second conductivity type.

The guard ring region may surround the second well.

The first well may extend from a bottom surface of the second well to a side surface of the second well.

The single-photon detection device may further include a third well surrounding the first well and the second well, wherein the third well has the first conductivity type.

The single-photon detection device may further include a second depletion forming region provided opposite to the first well with the third well therebetween, and a third sub-depletion region provided between the second depletion forming region and the third well, wherein the second depletion forming region has the second conductivity type.

The single-photon detection device may further include a third contact region provided on the third well and spaced apart from the second well, wherein the third contact region has the first conductivity type.

A doping concentration of the third well may be lower than a doping concentration of the first well.

The third well may contact a side surface of the second well.

According to one or more embodiments, a single-photon detector includes a single-photon detection device configured to generate an electrical signal by receiving light, a control layer configured to process the electrical signal, and a lens unit configured to receive the light from outside and focus the light on the single-photon detection device, wherein the single-photon detection device includes a first well having a first conductivity type, a second well provided on the first well and having a second conductivity type that is different from the first conductivity type, a first depletion forming region provided on the second well and having the first conductivity type, a main depletion region provided between the first well and the second well, and a first sub-depletion region provided between the second well and the first depletion forming region, wherein the first well and the first depletion forming region are spaced apart from each other by the second well.

The control layer may be disposed between the single-photon detection device and the lens unit.

The single-photon detection device may be disposed between the control layer and the lens unit.

The first depletion forming region may be disposed closer to the control layer than the lens unit.

The control layer may include an insulating layer, wirings, and circuits, wherein the wirings electrically connect the first well and the second well to the circuits, and the circuits include a quenching circuit and a readout circuit.

The circuits may further include at least one of a recharge circuit, a memory, an amplification circuit, a counter, and a gate circuit.

The single-photon detector may include at least one of a color filter, a bandpass filter, an anti-reflection coating, a two-dimensional (2D) nanomaterial, and an organic material provided on the single-photon detection device.

According to one or more embodiments, a single-photon detector array includes a plurality of single-photon detection devices configured to generate an electrical signal by receiving light, a control layer configured to process the electrical signal, and a plurality of lenses configured to receive the light from outside and respectively focus the light on the plurality of single-photon detection devices, wherein each of the plurality of single-photon detection devices includes a first well having a first conductivity type, a second well provided on the first well and having a second conductivity type that is different from the first conductivity type, a first depletion forming region provided on the second well and having the first conductivity type, a main depletion region provided between the first well and the second well, and a first sub-depletion region provided between the second well and the first depletion forming region, wherein the first well and the first depletion forming region are spaced apart from each other by the second well.

BRIEF DESCRIPTION OF THE DRAWINGS

The above and other aspects, features, and advantages of certain embodiments will be more apparent from the following description taken in conjunction with the accompanying drawings, in which.

DETAILED DESCRIPTION

Figure 1:
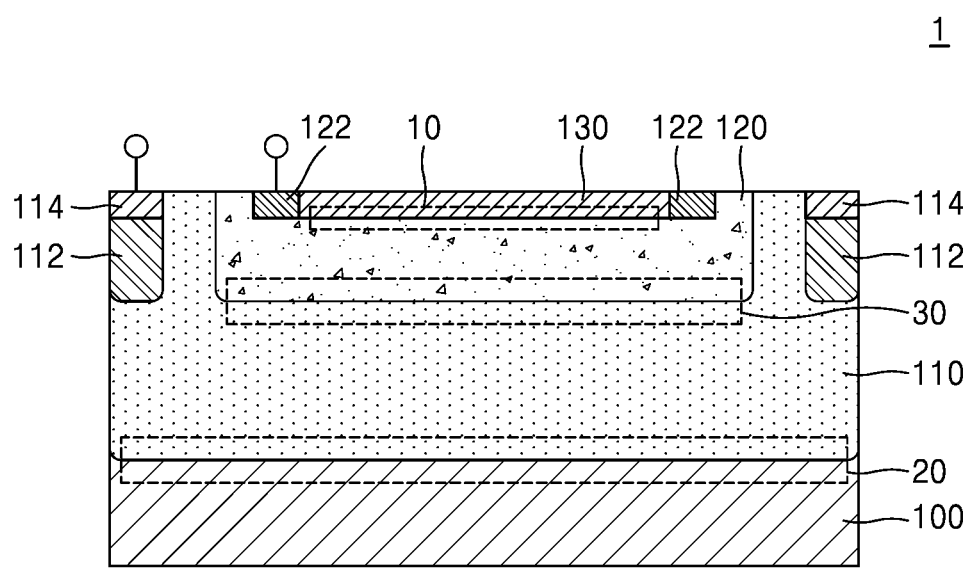
FIG. 1 is a cross-sectional view illustrating a single-photon detection device, according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

Hereinafter, embodiments of the disclosure will be described with reference to the drawings. Like reference numerals denote like elements throughout, and in the drawings, sizes of elements may be exaggerated for clarity and convenience of explanation. Also, the embodiments described below are merely examples, and various modifications may be made from the embodiments.

When an element is referred to as being "on" another element, it may be directly on the other element, or intervening elements may be present therebetween.

The singular forms "a," "an," and "the" are intended to include the plural forms as well, unless the context clearly indicates otherwise. When a portion "includes" an element, another element may be further included, rather than excluding the existence of the other element, unless otherwise described.

Also, the term such as " . . . unit" used therein refers to a unit for processing at least one function or operation.

FIG. 1 is a cross-sectional view illustrating a single-photon detection device, according to an embodiment.

Referring to FIG. 1, a single-photon detection device 1 may be provided. The single-photon detection device 1 may include a single-photon avalanche diode (SPAD). For example, the SPAD may be referred to as a Geiger-mode avalanche photodiode (APD) (G-APD). The single-photon detection device 1 may include a first well 110, a second well 120, a first contact region 114, a first relaxation region 112, a first depletion forming region 130, a second contact region 122, and a second depletion forming region 100. The first well 110, the second well 120, the first contact region 114, the first relaxation region 112, the first depletion forming region 130, the second contact region 122, and the second depletion forming region 100 may be formed by doping a semiconductor substrate (e.g., a p-type or n-type silicon (Si) substrate). For example, the semiconductor substrate may be a p-type or n-type epitaxial (epi) layer. The second depletion forming region 100 may be formed by using an epitaxial growth process.

The first well 110 may have a first conductivity type. When a conductivity type of the semiconductor substrate is p-type, a conductivity type of the first well 110 may be n-type. When a conductivity type of the first well 110 is n-type, the first well 110 may be formed by implanting a group 5 element (e.g., phosphorus (P), arsenic (As), or antimony (Sb)), a group 6 element, or a group 7 element as impurities into a silicon (Si) substrate. When a conductivity type of the semiconductor substrate is n-type, a conductivity type of the first well 110 may be p-type. When a conductivity type of the first well 110 is p-type, the first well 110 may be formed by implanting a group 3 element (e.g., boron (B), aluminum (Al), gallium (Ga), or indium (In)) or a group 2 element as impurities into a silicon (Si) substrate. For example, a doping concentration of the first well 110 may range from about $1 \times 10^{14}$ cm$^{-3}$ to about $1 \times 10^{19}$ cm$^{-3}$. In an example, a doping concentration of the first well 110 may have a gradient that decreases toward an upper portion of the first well 110. In another example, the first well 110 may have a uniform doping concentration.

The second well 120 may have a second conductivity type that is different from the first conductivity type. When a conductivity type of the first well 110 is n-type, a conductivity type of the second well 120 may be p-type. When a conductivity type of the first well 110 is p-type, a conductivity type of the second well 120 may be n-type. For example, a doping concentration of the second well 120 may range from about $1 \times 10^{15}$ cm$^{-3}$ to about $1 \times 10^{18}$ cm$^{-3}$.

A first main depletion region 30 may be formed in a portion adjacent to an interface between the first well 110 and the second well 120. When a reverse bias is applied to the single-photon detection device 1, a strong electric field may be applied to the first main depletion region 30. For example, when the single-photon detection device 1 operates as an SPAD, a maximum strength of the electric field may range from about $1 \times 10^5$ V/cm to about $1 \times 10^6$ V/cm. Because electrons may be multiplied by an electric field of the first main depletion region 30, the first main depletion region 30 may be referred to as a multiplication region.

The first contact region 114 may be located on the first well 110. The first contact region 114 may be electrically connected to a circuit outside the single-photon detection device 1. For example, a voltage may be applied to the first well 110 from the circuit outside the single-photon detection device 1 through the first contact region 114. The first contact region 114 may be located on a side surface of the second well 120. The first contact region 114 may surround the second well 120. For example, the first contact region 114 may have an annular shape extending along the side surface of the second well 120. The first contact region 114 may be spaced apart from the second well 120. The first well 110 may extend to a portion between the first contact region 114 and the second well 120. For example, the portion between the first contact region 114 and the second well 120 may be filled with the first well 110.

The first contact region 114 may have the first conductivity type. A doping concentration of the first contact region 114 may be higher than a doping concentration of the first well 110. For example, a doping concentration of the first contact region 114 may range from about $1 \times 10^{15}$ cm$^{-3}$ to about $1 \times 10^{22}$ cm$^{-3}$.

The first relaxation region 112 may be located or provided between the first contact region 114 and the first well 110. The first relaxation region 112 may be electrically connected to the first contact region 114 and the first well 110. The first relaxation region 112 may reduce a difference between a bandgap of the first contact region 114 and a bandgap of the first well 110. The first relaxation region 112 may be located or provided on a side surface of the second well 120. The first relaxation region 112 may surround the second well 120. For example, the first relaxation region 112 may have an annular shape extending in a direction in which the side surface of the second well 120 extends. The first relaxation region 112 may be located or provided under the first contact region 114. For example, side surfaces of the first relaxation region 112 may be coplanar with side surfaces of the first contact region 114. The first relaxation region 112 may be spaced apart from the second well 120. The first well 110 may extend into a portion between the first relaxation region 112 and the second well 120. For example, the portion between the first relaxation region 112 and the second well 120 may be filled with the first well 110. The first relaxation region 112 may be formed to be deeper than the second well 120. For example, a bottom surface of the first relaxation region 112 may be spaced apart farther away from a top surface of the single-photon detection device 1 than a bottom surface of the second well 120. The first relaxation region 112 may have the first conductivity type. A doping concentration of the first relaxation region 112 may be lower than a doping concentration of the first contact region 114, and may be higher than a doping concentration of the first well 110. For example, a doping concentration of the first relaxation region 112 may range from about $1\times10^{15}$ cm$^{-3}$ to about $1\times10^{19}$ cm$^{-3}$.

The first depletion forming region 130 may be located or provided on the second well 120. The first depletion forming region 130 may have the first conductivity type. A doping concentration of the first depletion forming region 130 may be higher than a doping concentration of the first well 110. For example, a doping concentration of the first depletion forming region 130 may range from about $1\times10^{15}$ cm$^{-3}$ to about $1\times10^{22}$ cm$^{-3}$.

A first sub-depletion region 10 may be formed in a portion adjacent to an interface between the first depletion forming region 130 and the second well 120. The first sub-depletion region 10 may reduce or substantially prevent electrons or holes other than electron-hole pairs generated by photons in the single-photon detection device 1 from being provided to a first main depletion region 30. For example, electrons or holes other than electron-hole pairs generated by photons in the single-photon detection device 1 may be generated due to defects of a surface of the single-photon detection device 1 adjacent to the first sub-depletion region 10. The first sub-depletion region 10 may reduce or substantially prevent the electrons or holes due to the surface defects of the single-photon detection device 1 from moving to the first main depletion region 30.

The second contact region 122 may be located or provided on the second well 120. The second contact region 122 may be electrically connected to a circuit outside the single-photon detection device 1. For example, when the single-photon detection device 1 is a SPAD, the single-photon detection device 1 may be electrically connected to a quenching resistor or circuit and other pixel circuits through the second contact region 122. The quenching resistor or circuit may stop an avalanche effect and may enable the SPAD to detect another photon. The other pixel circuits may include a reset or recharge circuit, a memory, an amplification circuit, a counter, and a gate circuit, and may transmit signal current to the single-photon detection device 1 or may receive signal current from the single-photon detection device 1. The second contact region 122 may be located or provided on a side surface of the first depletion forming region 130. The second contact region 122 may surround the first depletion forming region 130. For example, the second contact region 122 may have an annular shape extending along the side surface of the first depletion forming region 130. The second contact region 122 may have an inner surface adjacent to the first depletion forming region 130 and an outer surface located or provided opposite to the inner surface. In an embodiment, the second contact region 122 may contact the first depletion forming region 130. For example, the inner surface of the second contact region 122 may contact the side surface of the first depletion forming region 130. In an embodiment, the second contact region 122 may be spaced apart from the first depletion forming region 130. For example, the inner surface of the second contact region 122 may face the first depletion forming region 130 and may be spaced apart from the first depletion forming region 130. The second contact region 122 may have a second conductivity type. A doping concentration of the second contact region 122 may be higher than a doping concentration of the second well 120. For example, a doping concentration of the second contact region 122 may range from about $1\times10^{15}$ cm$^{-3}$ to about $1\times10^{22}$ cm$^{-3}$. The outer surface of the second contact region 122 may be covered by the second well 120. In other words, the second well 120 may extend to the outer surface of the second contact region 122.

The second depletion forming region 100 may be located or provided opposite to the second well 120 with the first well 110 therebetween. The second depletion forming region 100 may have the second conductivity type. For example, a doping concentration of the second depletion forming region 100 may range from about $1\times10^{14}$ cm$^{-3}$ to about $1\times10^{22}$ cm$^{-3}$.

A second sub-depletion region 20 may be formed in a portion adjacent to an interface between the second depletion forming region 100 and the first well 110. The second sub-depletion region 20 may reduce or substantially prevent electrons or holes other than electron-hole pairs generated by photons in the single-photon detection device 1 from being provided to the first main depletion region 30. For example, electrons or holes other than electron-hole pairs generated by photons in the single-photon detection device 1 may be generated due to surface defects of the single-photon detection device 1 adjacent to the second sub-depletion region 20. The second sub-depletion region 20 may reduce or substantially prevent the electrons or holes due to the surface defects of the single-photon detection device 1 from moving to the first main depletion region 30.

The single-photon detection device 1 may have surface defects. Electrons or holes may be generated due to the surface defects of the single-photon detection device 1. When the electrons or holes generated due to the surface defects move to the first main depletion region 30, the electrons or holes may be multiplied and may generate a noise signal. That is, even when a photon is not provided to the single-photon detection device 1, the single-photon detection device 1 may generate a noise signal.

The first sub-depletion region 10 and the second sub-depletion region 20 of the disclosure may reduce or substantially prevent electrons or holes generated due to surface defects of the single-photon detection device 1 from moving to the first main depletion region 30. Accordingly, the single-photon detection device 1 having low noise may be provided. Both or only one of the first sub-depletion region 10 and the second sub-depletion region 20 may be implemented.

Figure 2:
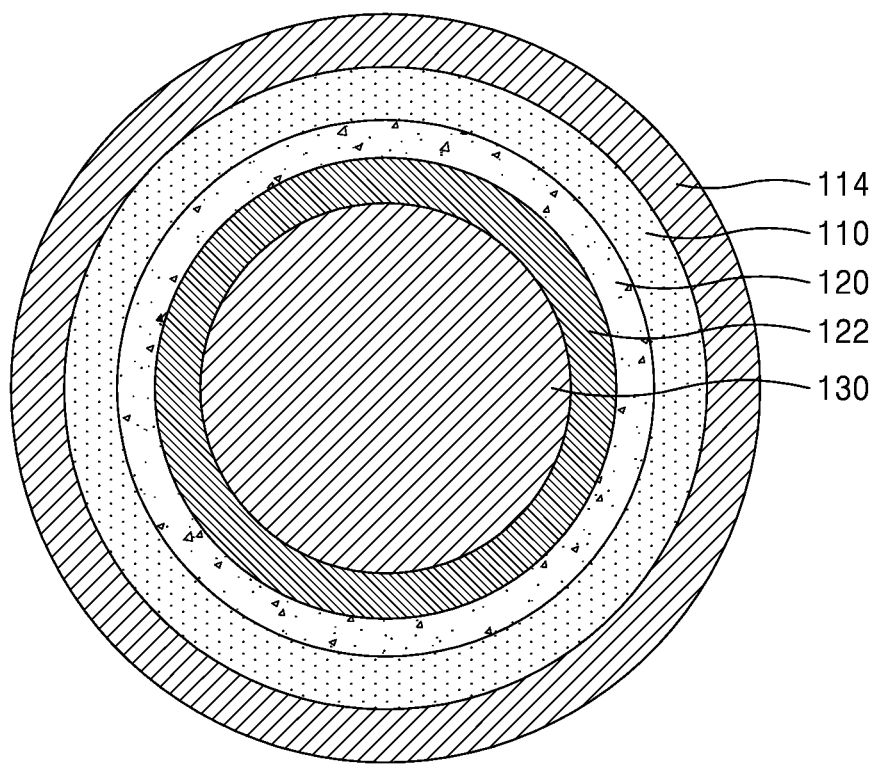
FIG. 2 is a plan view illustrating the single-photon detection device of FIG. 1, according to an embodiment.

FIG. 2 is a plan view illustrating the single-photon detection device of FIG. 1, according to an embodiment.

Referring to FIG. 2, a single-photon detection device 1a(1) may have a circular shape. In detail, the first depletion forming region 130 may have a circular shape, and the second contact region 122, the first contact region 114, the second well 120, and the first well 110 may each have a circular annular shape. The second contact region 122, the second well 120, the first well 110, and the first contact region 114 may surround the first depletion forming region 130. For example, the first depletion forming region 130, the second contact region 122, the second well 120, the first well 110, and the first contact region 114 may have the same center. The second contact region 122, the second well 120, the first well 110, and the first contact region 114 may be sequentially arranged away from the first depletion forming region 130.

Figure 3:
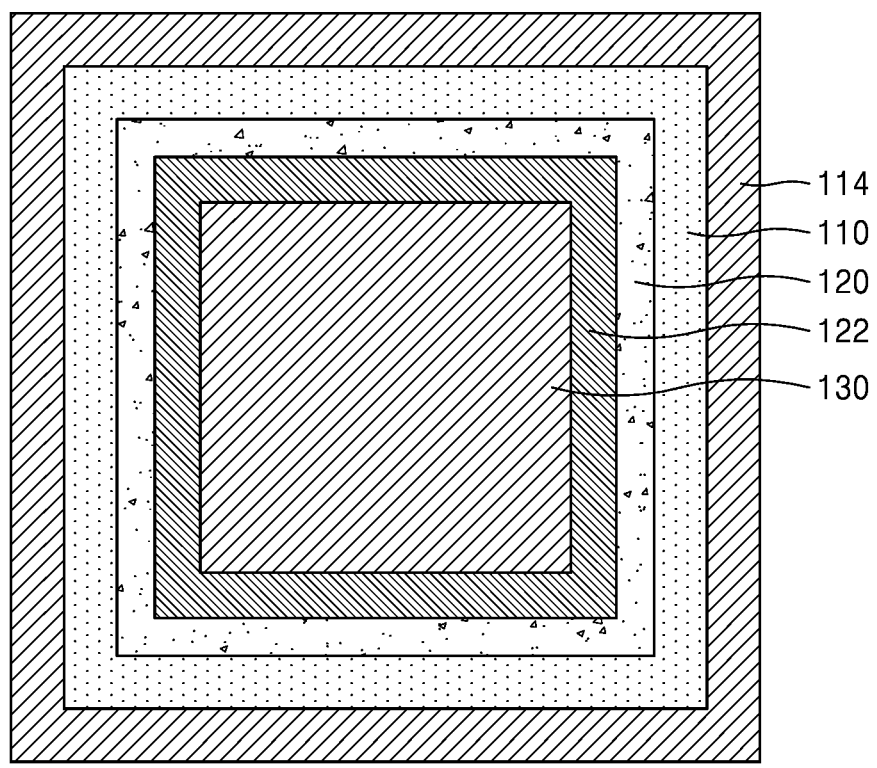
FIG. 3 is a plan view illustrating the single-photon detection device of FIG. 1, according to an embodiment.

FIG. 3 is a plan view illustrating the single-photon detection device of FIG. 1, according to an embodiment.

Referring to FIG. 3, a single-photon detection device 1*b*(1) may have a square shape. In detail, the first depletion forming region 130 may have a square shape, and the second contact region 122, the second well 120, the first well 110, and the first contact region 114 may each have a square annular shape. The second contact region 122, the second well 120, the first well 110, and the first contact region 114 may surround the first depletion forming region 130. For example, the first depletion forming region 130, the second contact region 122, the second well 120, the first well 110, and the first contact region 114 may have the same center. The second contact region 122, the second well 120, the first well 110, and the first contact region 114 may be sequentially arranged away from the first depletion forming region 130.

Figure 4:
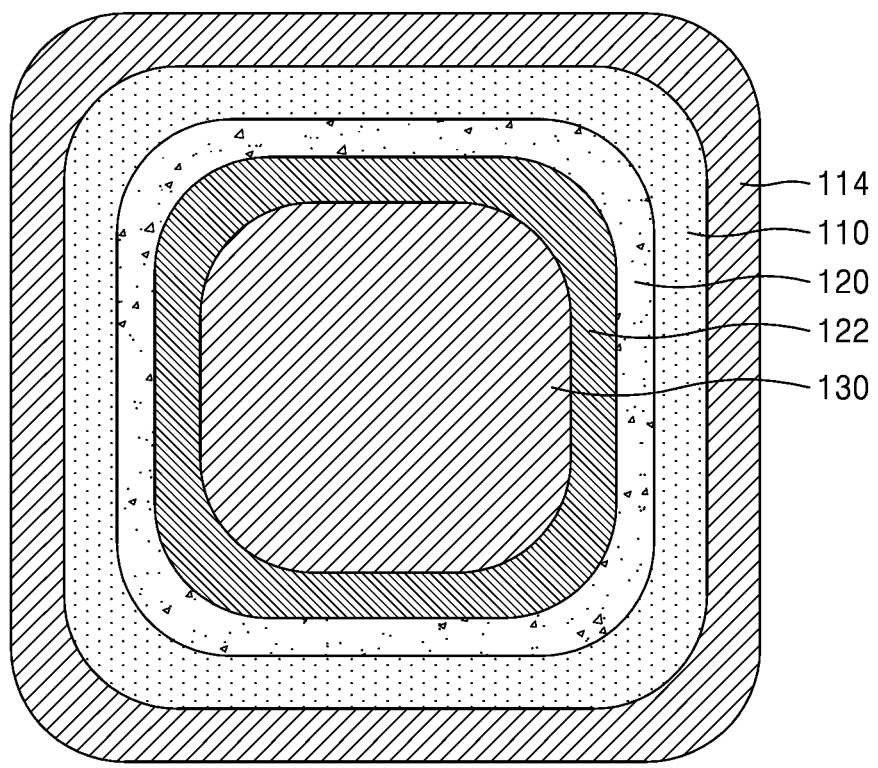
FIG. 4 is a plan view illustrating the single-photon detection device of FIG. 1, according to an embodiment.

FIG. 4 is a plan view illustrating the single-photon detection device of FIG. 1, according to an embodiment.

Referring to FIG. 4, a single-photon detection device 1*c*(1) may have a square shape with round corners. In detail, the first depletion forming region 130 may have a square shape with round corners, and the second contact region 122, the second well 120, the first well 110, and the first contact region 114 may each have a square annular shape with round corners. The second contact region 122, the second well 120, the first well 110, and the first contact region 114 may surround the first depletion forming region 130. For example, the first depletion forming region 130, the second contact region 122, the second well 120, the first well 110, and the first contact region 114 may have the same center. The second contact region 122, the second well 120, the first well 110, and the first contact region 114 may be sequentially arranged away from the first depletion forming region 130.

Figure 5:
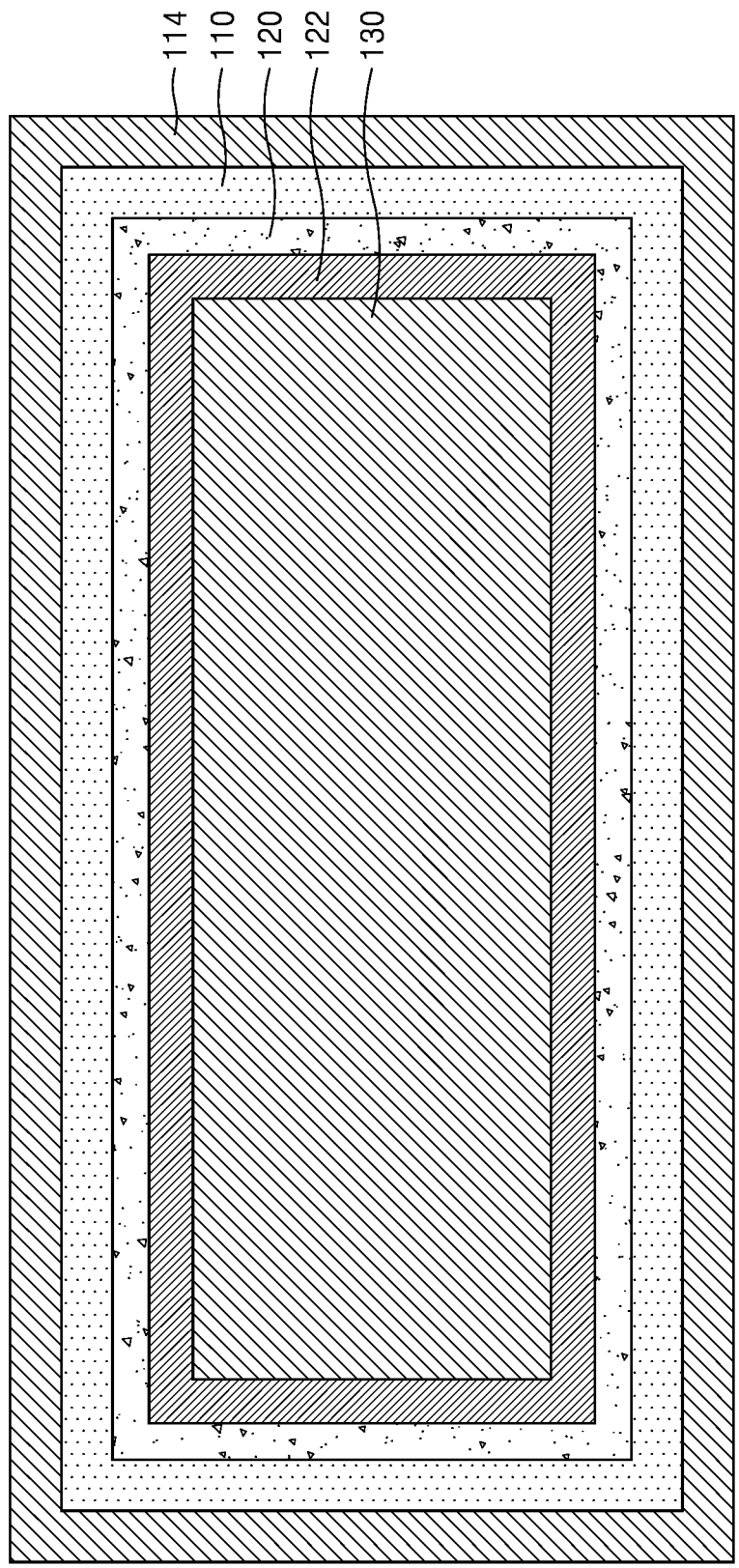
FIG. 5 is a plan view illustrating the single-photon detection device of FIG. 1, according to an embodiment.

FIG. 5 is a plan view illustrating the single-photon detection device of FIG. 1, according to an embodiment.

Referring to FIG. 5, a single-photon detection device 1*d*(1) may have a rectangular shape. In detail, the first depletion forming region 130 may have a rectangular shape, and the second contact region 122, the second well 120, the first well 110, and the first contact region 114 may each have a rectangular annular shape. The second contact region 122, the second well 120, the first well 110, and the first contact region 114 may surround the first depletion forming region 130. For example, the first depletion forming region 130, the second contact region 122, the second well 120, the first well 110, and the first contact region 114 may have the same center. The second contact region 122, the second well 120, the first well 110, and the first contact region 114 may be sequentially arranged away from the first depletion forming region 130.

Figure 6:
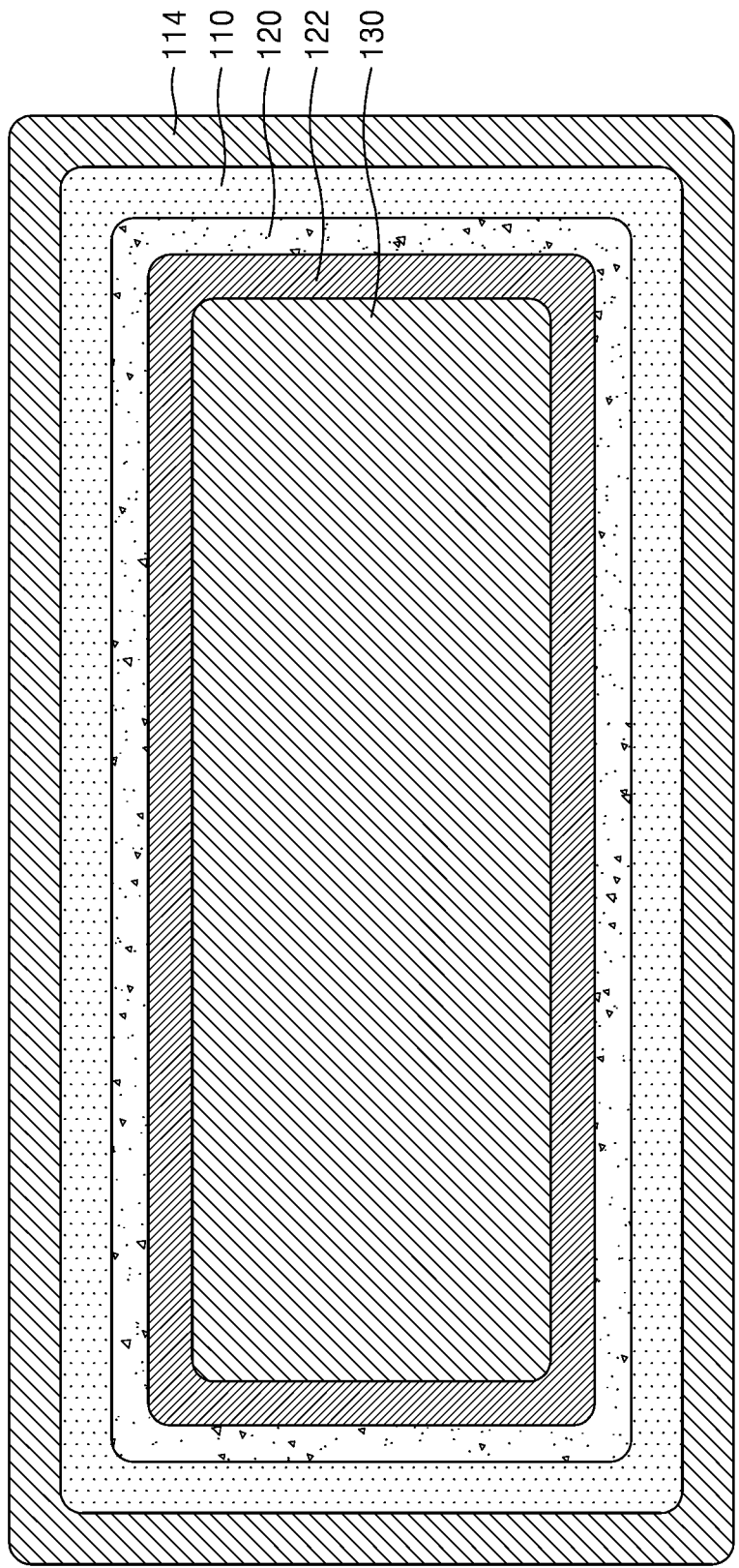
FIG. 6 is a plan view illustrating the single-photon detection device of FIG. 1, according to an embodiment.

FIG. 6 is a plan view illustrating the single-photon detection device of FIG. 1, according to an embodiment.

Referring to FIG. 6, a single-photon detection device 1*e*(1) may have a rectangular shape with round corners. In detail, the first depletion forming region 130 may have a rectangular shape with round corners, and the second contact region 122, the second well 120, the first well 110, and the first contact region 114 may each have a rectangular annular shape with round corners. The second contact region 122, the second well 120, the first well 110, and the first contact region 114 may surround the first depletion forming region 130. For example, the first depletion forming region 130, the second contact region 122, the second well 120, the first well 110, and the first contact region 114 may have the same center. The second contact region 122, the second well 120, the first well 110, and the first contact region 114 may be sequentially arranged away from the first depletion forming region 130.

Figure 7:
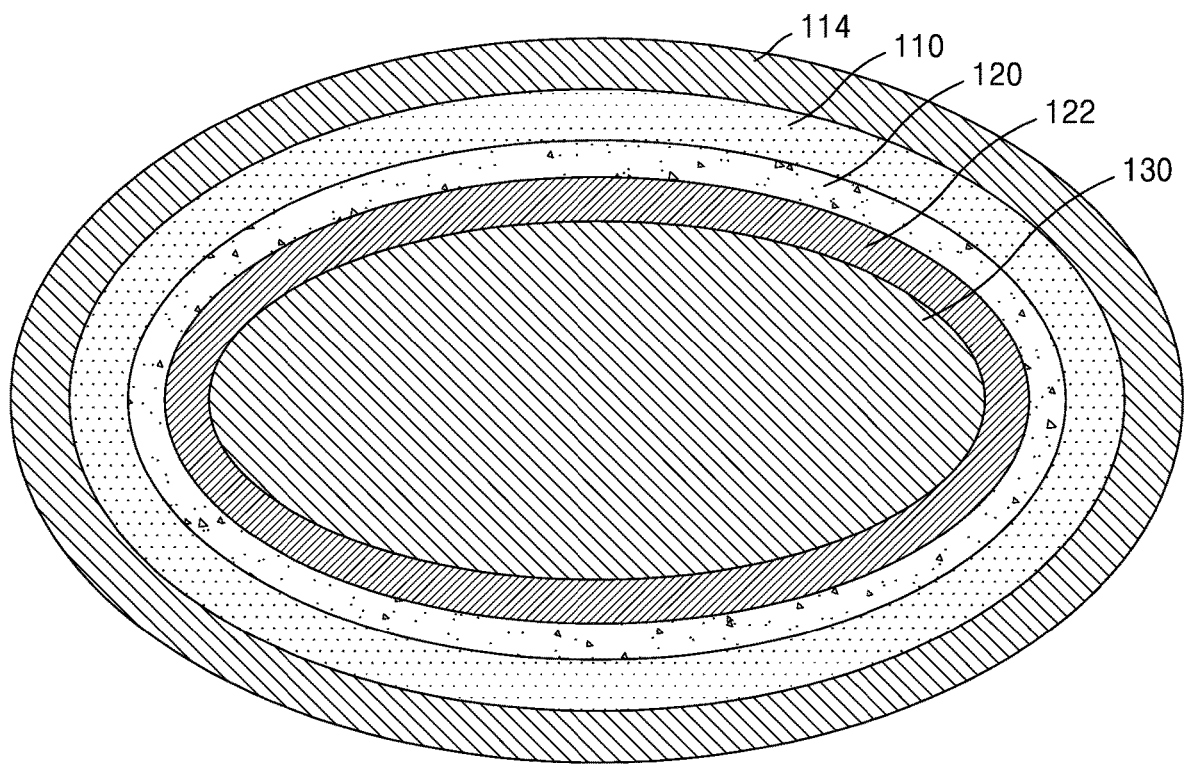
FIG. 7 is a plan view illustrating the single-photon detection device of FIG. 1, according to an embodiment.

FIG. 7 is a plan view illustrating the single-photon detection device of FIG. 1, according to an embodiment.

Referring to FIG. 7, a single-photon detection device 1*f*(1) may have an elliptical shape. In detail, the first depletion forming region 130 may have an elliptical shape, and the second contact region 122, the second well 120, the first well 110, and the first contact region 114 may each have an elliptical shape. The second contact region 122, the second well 120, the first well 110, and the first contact region 114 may surround the first depletion forming region 130. For example, the first depletion forming region 130, the second contact region 122, the second well 120, the first well 110, and the first contact region 114 may have the same center. The second contact region 122, the second well 120, the first well 110, and the first contact region 114 may be sequentially arranged away from the first depletion forming region 130.

Figure 8:
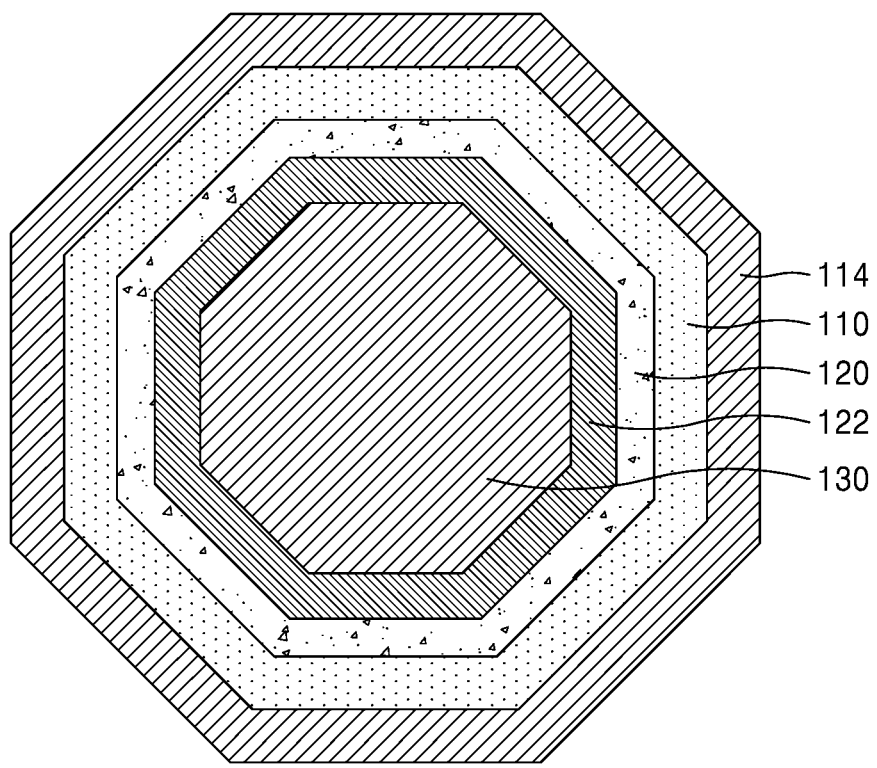
FIG. 8 is a plan view illustrating the single-photon detection device of FIG. 1, according to an embodiment.

FIG. 8 is a plan view illustrating the single-photon detection device of FIG. 1, according to an embodiment.

Referring to FIG. 8, a single-photon detection device 1*g*(1) may have an octagonal shape. In detail, the first depletion forming region 130 may have an octagonal shape, and the second contact region 122, the second well 120, the first well 110, and the first contact region 114 may each have an octagonal shape. The second contact region 122, the second well 120, the first well 110, and the first contact region 114 may surround the first depletion forming region 130. For example, the first depletion forming region 130, the second contact region 122, the second well 120, the first well 110, and the first contact region 114 may have the same center. The second contact region 122, the second well 120, the first well 110, and the first contact region 114 may be sequentially arranged away from the first depletion forming region 130.

Figure 9:
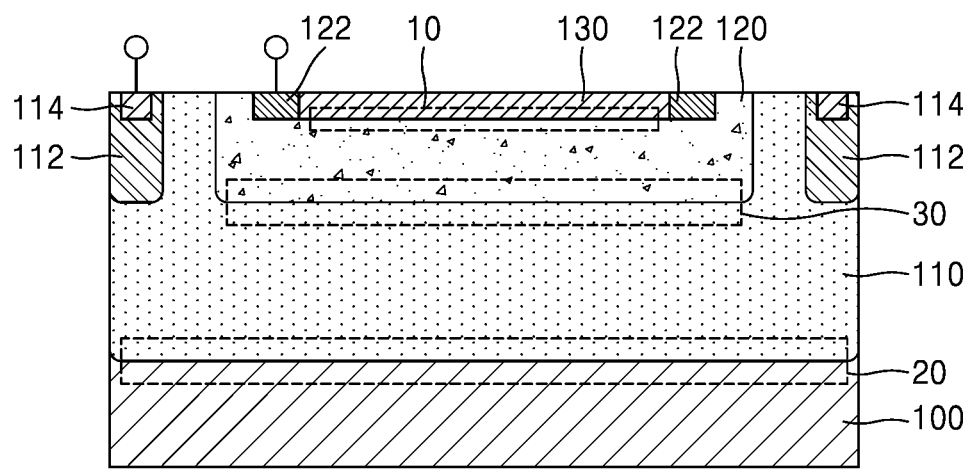
FIG. 9 is a cross-sectional view illustrating a single-photon detection device, according to an embodiment.

FIG. 9 is a cross-sectional view illustrating a single-photon detection device, according to an embodiment. For brevity of explanation, the same description as that made with reference to FIG. 1 will be omitted.

Referring to FIG. 9, a single-photon detection device 2 may be provided. The single-photon detection device 2 may include a SPAD. The single-photon detection device 2 may be substantially the same as the single-photon detection device 1 of FIG. 1, except for shapes of the first contact region 114 and the first relaxation region 112.

Unlike in FIG. 1, a width of the first contact region 114 may be less than a width of the first relaxation region 112. The first contact region 114 may be located inside the first relaxation region 112. Side surfaces of the first contact region 114 may be spaced apart from an outer surface of the first relaxation region 112.

A top surface of the first contact region 114 may be coplanar with a top surface of the first relaxation region 112. For example, a top surface of the first contact region 114 may be located between top surfaces of the first relaxation region 112.

Figure 10:
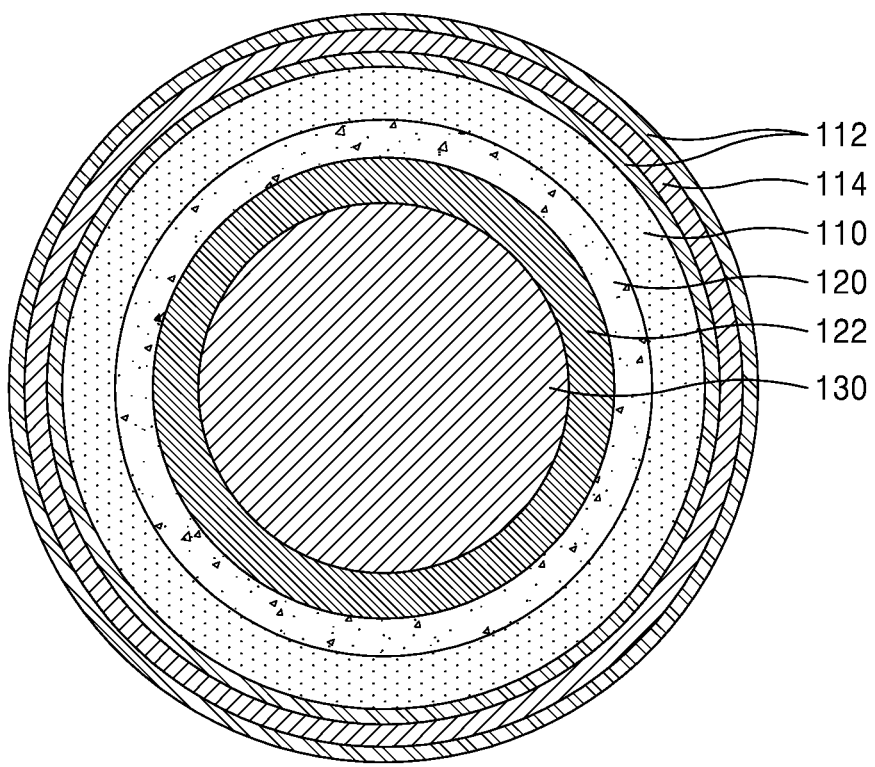
FIG. 10 is a plan view illustrating the single-photon detection device of FIG. 9, according to an embodiment.

FIG. 10 is a plan view illustrating the single-photon detection device of FIG. 9, according to an embodiment.

Referring to FIG. 10, the single-photon detection device 2 may have a circular shape. In detail, the first depletion forming region 130 may have a circular shape, and the second contact region 122, the second well 120, the first well 110, the first relaxation region 112, and the first contact region 114 may each have a circular annular shape. The second contact region 122, the second well 120, the first well 110, the first relaxation region 112, and the first contact region 114 may surround the first depletion forming region 130. For example, the first depletion forming region 130, the second contact region 122, the second well 120, the first well 110, the first relaxation region 112, and the first contact region 114 may have the same center. The second contact region 122, the second well 120, the first well 110, the first relaxation region 112, and the first contact region 114 may be sequentially arranged away from the first depletion forming region 130.

Although the single-photon detection device 2 has a circular shape, the disclosure is not limited thereto. In another example, as shown in FIGS. 3 through 8, the single-photon detection device 2 may have a square shape, an octagonal shape, a square shape with round corners, a rectangular shape, a rectangular shape with round corners, or an elliptical shape.

Figure 11:
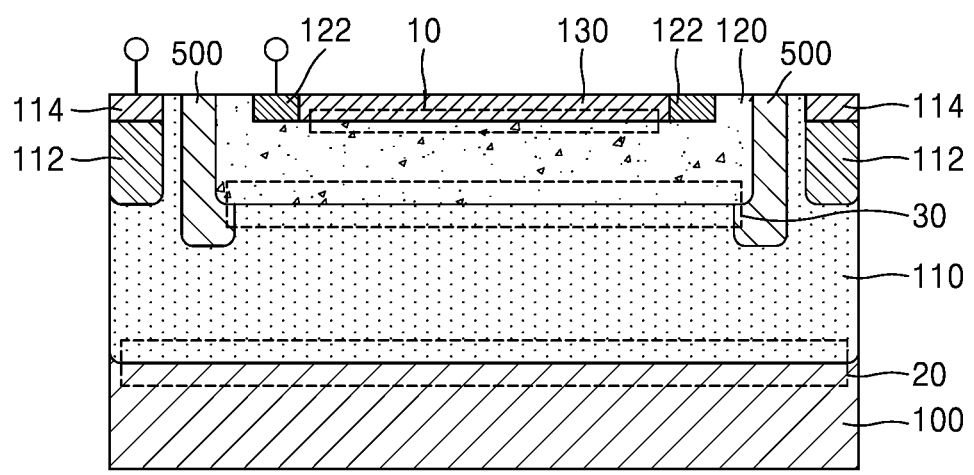
FIG. 11 is a cross-sectional view illustrating a single-photon detection device, according to an embodiment.

FIG. 11 is a cross-sectional view illustrating a single-photon detection device, according to an embodiment. For brevity of explanation, the same description as that made with reference to FIG. 1 will be omitted.

Referring to FIG. 11, a single-photon detection device 3 may be provided. The single-photon detection device 3 may include a SPAD. The single-photon detection device 3 may include the first well 110, the second well 120, the first contact region 114, the first relaxation region 112, the first depletion forming region 130, the second contact region 122, the second depletion forming region 100, and a guard ring region 500. The first well 110, the second well 120, the first contact region 114, the first relaxation region 112, the first depletion forming region 130, the second contact region 122, the second depletion forming region 100, and the guard ring region 500 may be formed on a semiconductor substrate (e.g., a p-type or n-type silicon (Si) substrate). For example, the semiconductor substrate may include a p-type or n-type epitaxial layer. The second depletion forming region 100 may be formed by using an epitaxial growth method.

The first well 110, the second well 120, the first contact region 114, the first relaxation region 112, the first depletion forming region 130, the second contact region 122, and the second depletion forming region 100 may be respectively substantially the same as the first well 110, the second well 120, the first contact region 114, the first relaxation region 112, the first depletion forming region 130, the second contact region 122, and the second depletion forming region 100 of FIG. 1.

The guard ring region 500 may be located or provided on a side surface of the second well 120. The guard ring region 500 may prevent premature breakdown by reducing the concentration of an electric field at an edge of the second well 120. Premature breakdown, which is a phenomenon where breakdown first occurs at an edge of the second well 120 before an electric field of a sufficient magnitude is applied to the first main depletion region 30, occurs as an electric field is concentrated at the edge of the second well 120. The guard ring region 500 may improve breakdown characteristics of the single-photon detection device 3. The guard ring region 500 may surround the second well 120. For example, the guard ring region 500 may have an annular shape extending along the side surface of the second well 120. The guard ring region 500 may directly contact the second well 120. The guard ring region 500 may be spaced apart from the first contact region 114 and the first relaxation region 112. The first well 110 may extend to a portion between the guard ring region 500 and the first relaxation region 112 and a portion between the guard ring region 500 and the first contact region 114. For example, the portion between the guard ring region 500 and the first relaxation region 112 and the portion between the guard ring region 500 and the first contact region 114 may be filled with the first well 110. The guard ring region 500 may protrude from an interface between the second well 120 and the first well 110 to the first well 110. The guard ring region 500 is not limited to being spaced apart from the first contact region 114 and the first relaxation region 112. In another example, the guard ring region 500 may directly contact the first contact region 114 and the first relaxation region 112. The guard ring region 500 may have the second conductivity type. A doping concentration of the guard ring region 500 may be lower than a doping concentration of the second well 120. For example, a doping concentration of the guard ring region 500 may range from about $1 \times 10^{15}$ cm$^{-3}$ to about $1 \times 10^{18}$ cm$^{-3}$.

According to the disclosure, the single-photon detection device 3 having low noise and improved breakdown characteristics may be provided.

Figure 12:
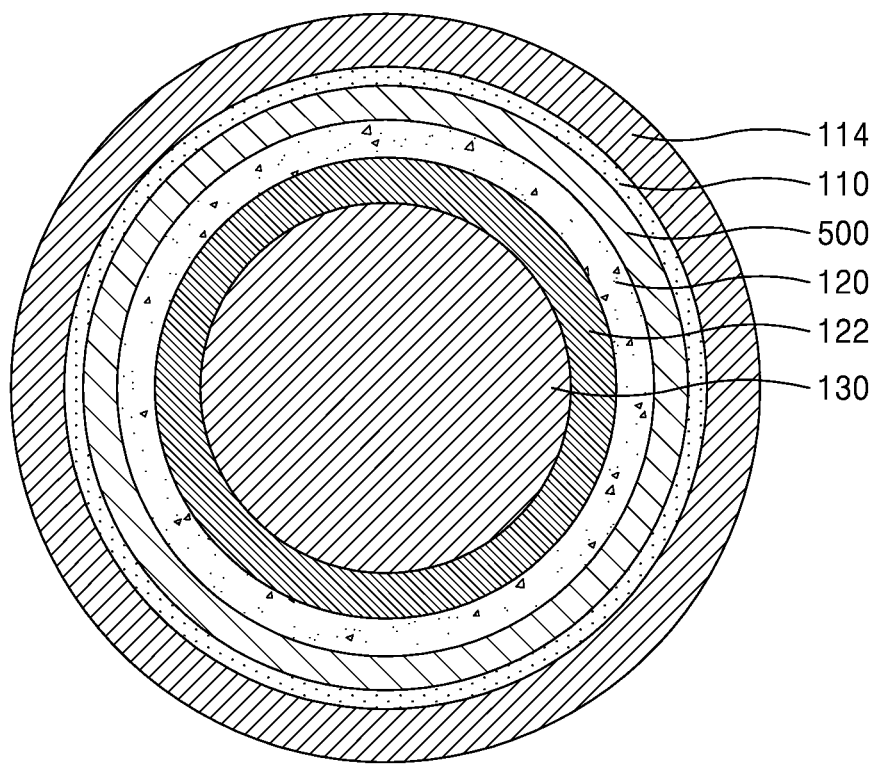
FIG. 12 is a plan view illustrating the single-photon detection device of FIG. 11, according to an embodiment.

FIG. 12 is a plan view illustrating the single-photon detection device of FIG. 11, according to an embodiment.

Referring to FIG. 12, the single-photon detection device 3 may have a circular shape. In detail, the first depletion forming region 130 may have a circular shape, and the second contact region 122, the second well 120, the guard ring region 500, the first well 110, and the first contact region 114 may each have a circular annular shape. The second contact region 122, the second well 120, the guard ring region 500, the first well 110, and the first contact region 114 may surround the first depletion forming region 130. For example, the first depletion forming region 130, the second contact region 122, the second well 120, the guard ring region 500, the first well 110, and the first contact region 114 may have the same center. The second contact region 122, the second well 120, the guard ring region 500, the first well 110, and the first contact region 114 may be arranged away from the first depletion forming region 130.

Although the single-photon detection device 3 has a circular shape, the disclosure is not limited thereto. In another example, as shown in FIGS. 3 through 8, the single-photon detection device 3 may have a square shape, an octagonal shape, a square shape with round corners, a rectangular shape, a rectangular shape with round corners, or an elliptical shape.

Figure 13:
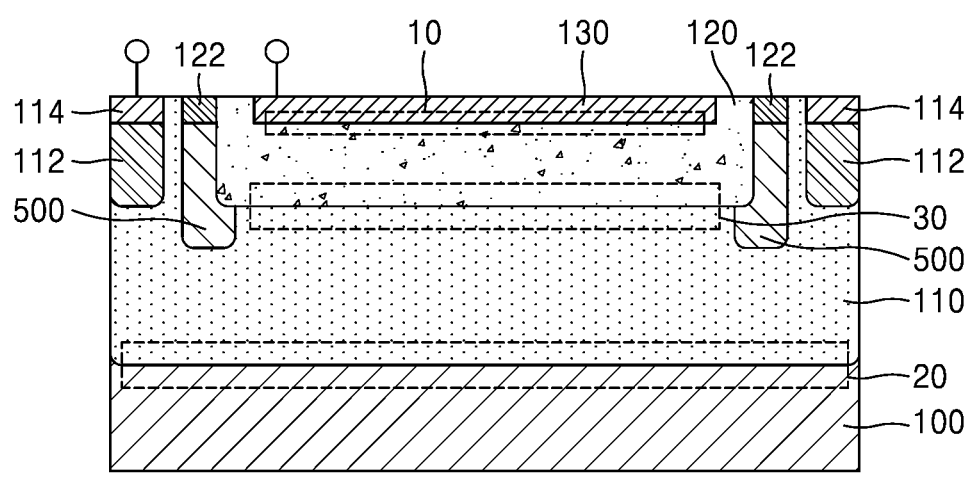
FIG. 13 is a cross-sectional view illustrating a single-photon detection device, according to an embodiment.

FIG. 13 is a cross-sectional view illustrating a single-photon detection device, according to an embodiment. For brevity of explanation, the same description as that made with reference to FIG. 11 will be omitted.

Referring to FIG. 13, a single-photon detection device 4 may be provided. The single-photon detection device 4 may be substantially the same as the single-photon detection device 3 of FIG. 11, except for the first depletion forming region 130, the second contact region 122, and the guard ring region 500.

The second contact region 122 may be located or disposed on the guard ring region 500. A side surface of the second contact region 122 may be coplanar with a side surface of the guard ring region 500 adjacent to the second contact region 122. Although the entire second contact region 122 is located or disposed on the guard ring region 500, the disclosure is not limited thereto. In another example, a part of the second contact region 122 may be located or disposed on the guard ring region 500. In another example, a width of the second contact region 122 may be less than a width of the guard ring region 500. The second contact region 122 may be located inside the guard ring region 500. Side surfaces of the second contact region 122 may be spaced apart from an outer surface of the guard ring region 500.

The second contact region 122 may be spaced apart from the first depletion forming region 130. A part of the second well 120 may be located or disposed between the second contact region 122 and the first depletion forming region 130. However, this is merely an example. In another example, the first depletion forming region 130 may extend to contact the second contact region 122 located or disposed on the guard ring region 500.

As the second contact region 122 is located or disposed on the guard ring region 500, the first depletion forming region 130 may be provided in a larger area as that described with reference to FIG. 11. Accordingly, the first sub-depletion region 10 may be formed wider than that described with reference to FIG. 11.

According to the disclosure, the single-photon detection device 4 having low noise and improved breakdown characteristics may be provided.

Figure 14:
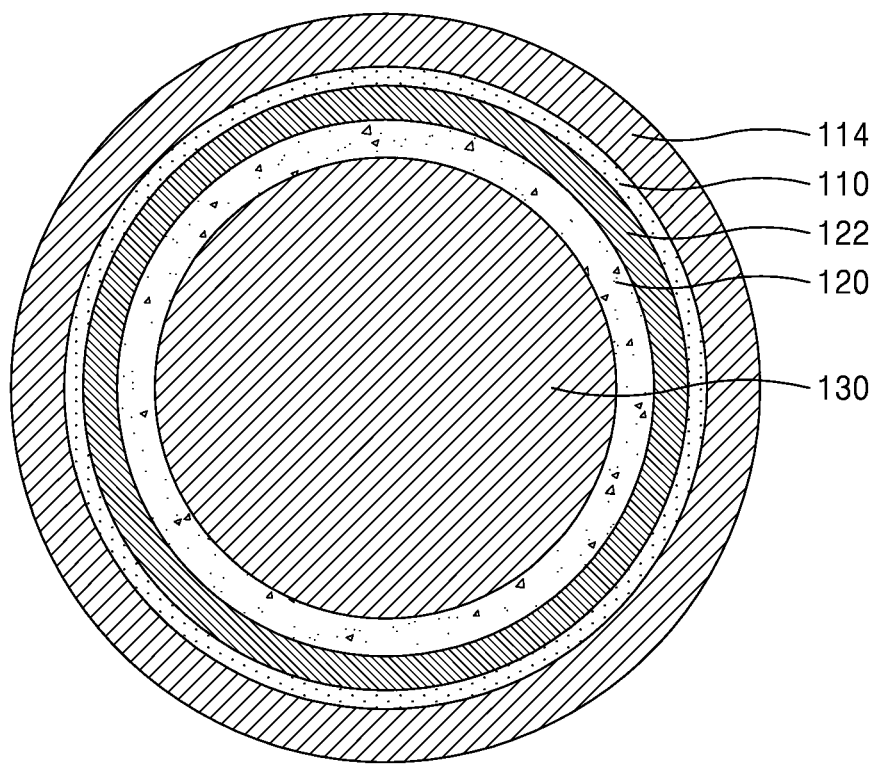
FIG. 14 is a plan view illustrating the single-photon detection device of FIG. 13, according to an embodiment.

FIG. 14 is a plan view illustrating the single-photon detection device of FIG. 13, according to an embodiment. For brevity of explanation, the same description as that made with reference to FIG. 12 will be omitted.

Referring to FIG. 14, the single-photon detection device 4 may have a circular shape. Unlike in FIG. 12, the guard ring region 500 (see FIG. 13) may be covered by the second contact region 122.

Although the single-photon detection device 4 has a circular shape, the disclosure is not limited thereto. In another example, as shown in FIGS. 3 through 8, the single-photon detection device 4 may have a square shape, an octagonal shape, a square shape with round corners, a rectangular shape, a rectangular shape with round corners, or an elliptical shape.

Figure 15:
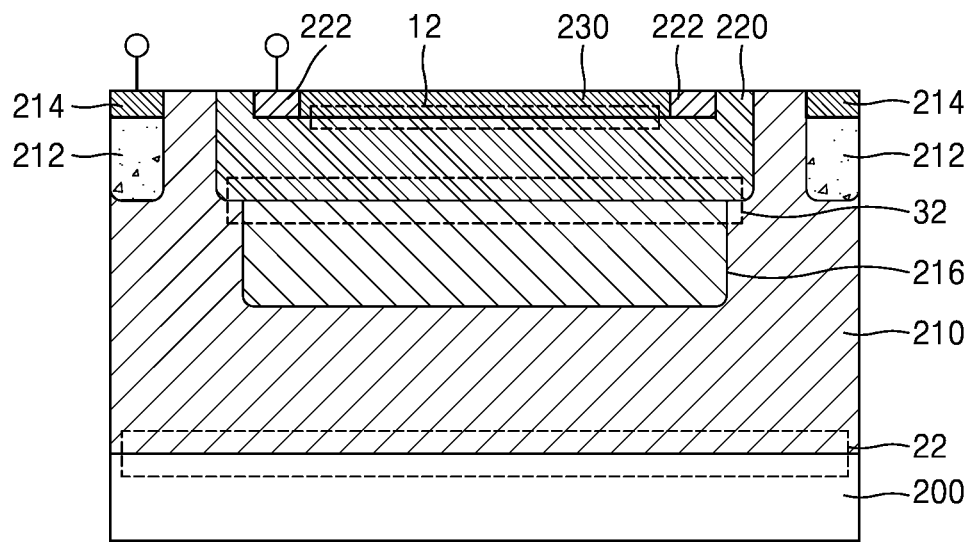
FIG. 15 is a cross-sectional view illustrating a single-photon detection device, according to an embodiment.

FIG. 15 is a cross-sectional view illustrating a single-photon detection device, according to an embodiment. For brevity of explanation, the same description as that made with reference to FIG. 1 will be omitted.

Referring to FIG. 15, a single-photon detection device 5 may be provided. The single-photon detection device 5 may include a SPAD. The single-photon detection device 5 may include a third well 210, a fourth well 220, a fifth well 216, a third contact region 214, a second relaxation region 212, a third depletion forming region 230, a fourth contact region 222, and a fourth depletion forming region 200. The third well 210, the fourth well 220, the fifth well 216, the third contact region 214, the second relaxation region 212, the third depletion forming region 230, the fourth contact region 222, and the fourth depletion forming region 200 may be regions formed by doping a semiconductor substrate (e.g., a p-type or n-type silicon (Si) substrate). For example, the semiconductor substrate may include a p-type or n-type epitaxial layer. The third well 210 may be formed by using an epitaxial growth process.

The third well 210, the fourth well 220, the third contact region 214, the second relaxation region 212, the third depletion forming region 230, the fourth contact region 222, and the fourth depletion forming region 200 may be respectively substantially the same as the first well 110, the second well 120, the first contact region 114, the first relaxation region 112, the first depletion forming region 130, the second contact region 122, and the second depletion forming region 100 of FIG. 1.

The fifth well 216 may be located or provided between the third well 210 and the fourth well 220. The fifth well 216 may be located or provided opposite to the third depletion forming region 230 with the fourth well 220 therebetween. For example, the fifth well 216 may be provided on a bottom surface of the fourth well 220. The fifth well 216 may have the same conductivity type as that of the third well 210. The fifth well 216 may have the first conductivity type. For example, a doping concentration of the fifth well 216 may range from about $1\times10^{14}$ cm$^{-3}$ to about $1\times10^{18}$ cm$^{-3}$. A second main depletion region 32 may be formed in a portion adjacent to an interface between the fifth well 216 and the fourth well 220. When a reverse bias is applied to the single-photon detection device 5, a strong electric field may be applied to the second main depletion region 32. For example, a maximum intensity of the electric field may range from about $1\times10^{5}$ V/cm to about $1\times10^{6}$ V/cm. Because electrons may be multiplied by an electric field of the second main depletion region 32, the second main depletion region 32 may be referred to as a multiplication region.

A third sub-depletion region 12 may be formed in a portion adjacent to an interface between the fourth well 220 and the third depletion forming region 230. The third sub-depletion region 12 may reduce or substantially prevent electrons or holes other than electron-hole pairs generated by photons in the single-photon detection device 5 from being provided to the second main depletion region 32. For example, electrons or holes other than electron-hole pairs generated by photons in the single-photon detection device 5 may be generated due to surface defects of the single-photon detection device 5 adjacent to the third sub-depletion region 12. The third sub-depletion region 12 may reduce or substantially prevent the electrons or holes due to the surface defects of the single-photon detection device 5 from moving to the second main depletion region 32.

A fourth sub-depletion region 22 may be formed in a portion adjacent to an interface between the fourth depletion forming region 200 and the third well 210. The fourth sub-depletion region 22 may reduce or substantially prevent electrons or holes other than electron-hole pairs generated by photons in the single-photon detection device 5 from being provided to the second main depletion region 32. For example, electrons or holes other than electron-hole pairs generated by photons in the single-photon detection device 5 may be generated due to surface defects of the single-photon detection device 5 adjacent to the fourth sub-depletion region 22. The fourth sub-depletion region 22 may reduce or substantially prevent the electrons or holes due to the surface defects of the single-photon detection device 5 from moving to the second main depletion region 32.

The single-photon detection device 5 may have surface defects. Electrons or holes may be generated due to the surface defects of the single-photon detection device 5. When the electrons or holes generated due to the surface defects move to the second main depletion region 32, the electrons or holes may be multiplied and may generate a noise signal. That is, even when a photon is not provided to the single-photon detection device 5, the single-photon detection device 5 may generate a noise signal.

The third sub-depletion region 12 and the fourth sub-depletion region 22 of the disclosure may reduce or substantially prevent electrons or holes generated due to surface defects of the single-photon detection device 5 from moving to the second main depletion region 32. Accordingly, the single-photon detection device 5 having low noise may be provided. Both or only one of the third sub-depletion region 12 and the fourth sub-depletion region 22 may be implemented.

Figure 16:
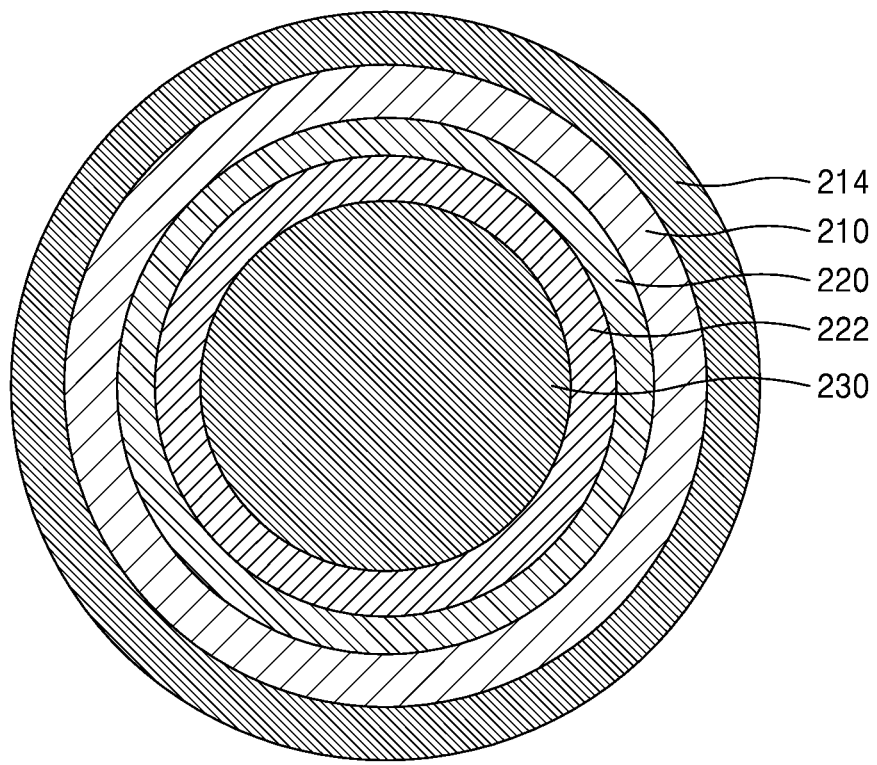
FIG. 16 is a plan view illustrating the single-photon detection device of FIG. 15, according to an embodiment.

FIG. 16 is a plan view illustrating the single-photon detection device of FIG. 15, according to an embodiment.

Referring to FIG. 16, the single-photon detection device 5 may have a circular shape. In detail, the third depletion forming region 230 may have a circular shape, and the fourth contact region 222, the fourth well 220, the third well 210, and the third contact region 214 may each have a circular annular shape. The fourth contact region 222, the fourth well 220, the third well 210, and the third contact region 214 may surround the third depletion forming region 230. For example, the third depletion forming region 230, the fourth contact region 222, the fourth well 220, the third well 210, and the third contact region 214 may have the same center. The fourth contact region 222, the fourth well 220, the third well 210, and the third contact region 214 may be sequentially arranged away from the third depletion forming region 230.

Although the single-photon detection device 5 has a circular shape, the disclosure is not limited thereto. In another example, as shown in FIGS. 3 through 8, the single-photon detection device 5 may have a square shape, an octagonal shape, a square shape with round corners, a rectangular shape, a rectangular shape with round corners, or an elliptical shape.

Figure 17:
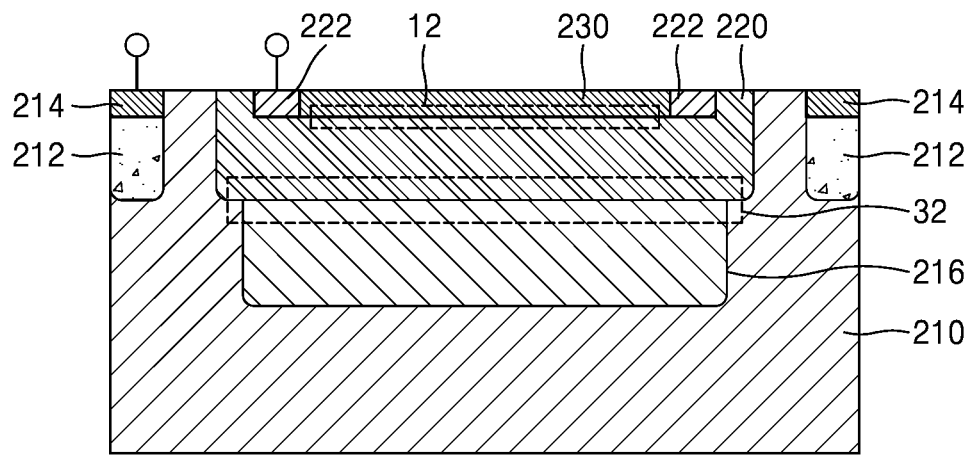
FIG. 17 is a cross-sectional view illustrating a single-photon detection device, according to an embodiment.

FIG. 17 is a cross-sectional view illustrating a single-photon detection device, according to an embodiment. For brevity of explanation, the same description as that made with reference to FIG. 15 will be omitted.

Referring to FIG. 17, a single-photon detection device 6 may be provided. The single-photon detection device 6 may include a SPAD. The single-photon detection device 6 may include the third well 210, the fourth well 220, the fifth well 216, the third contact region 214, the second relaxation region 212, the third depletion forming region 230, and the fourth contact region 222. The third well 210 may be formed by using an epitaxial growth process.

The single-photon detection device 6 may not include the fourth depletion forming region 200 (see FIG. 15), unlike in FIG. 15. Accordingly, the single-photon detection device 6 may not include the fourth sub-depletion region 22.

The third sub-depletion region 12 of the disclosure may reduce or substantially prevent electrons or holes generated due to defects of a surface of the single-photon detection device 6 adjacent to the third sub-depletion region 12 from moving to the second main depletion region 32. Accordingly, the single-photon detection device 6 having low noise may be provided.

Figure 18:
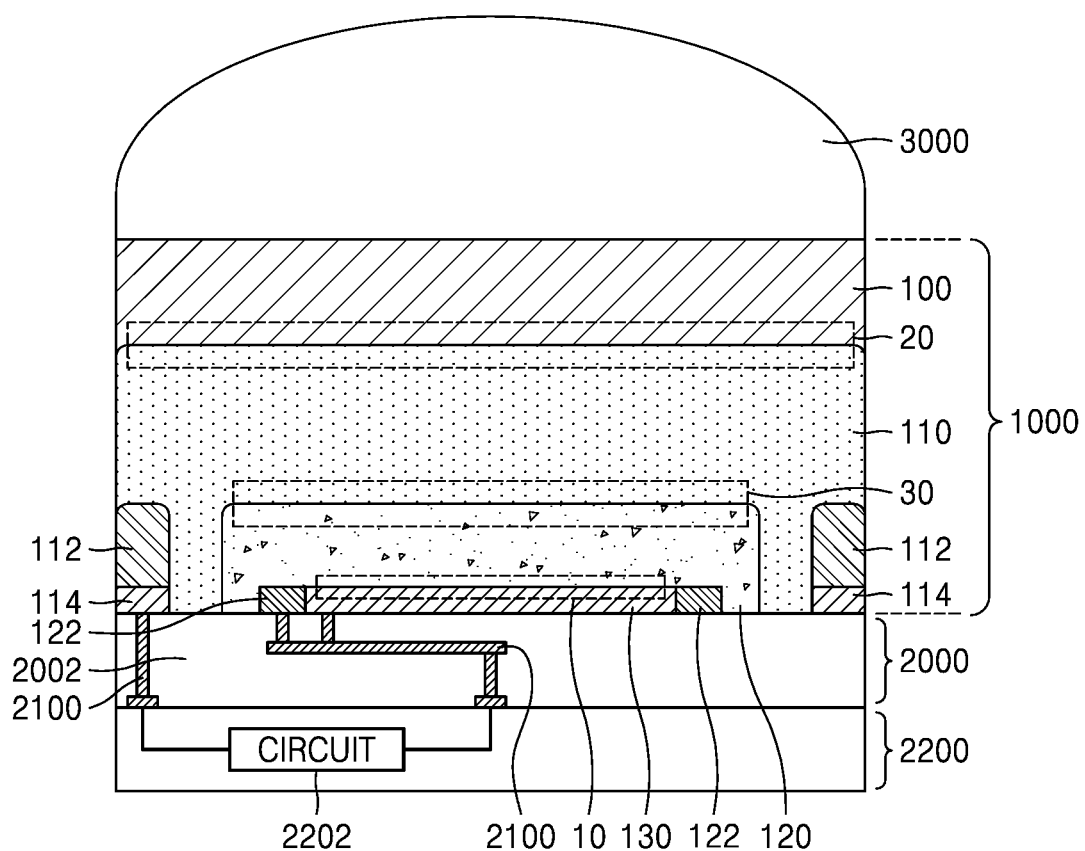
FIG. 18 is a cross-sectional view illustrating a single-photon detector, according to an embodiment.

FIG. 18 is a cross-sectional view illustrating a single-photon detector, according to an embodiment. For brevity of explanation, the same description as that made with reference to FIG. 1 will be omitted.

Referring to FIG. 18, a single-photon detector SE1 may be provided. The single-photon detector SE1 may be an image sensor using a backside illumination (BSI) method. The single-photon detector SE1 may include a single-photon detection device 1000, a connection layer 2000, a control layer 2200, and a lens unit 3000. The single-photon detection device 1000 may be substantially the same as the single-photon detection device 1 of FIG. 1. However, this is merely an example. In another example, the single-photon detection device 1000 may be any one of the single-photon detection devices 2, 3, 4, 5, and 6 described above or single-photon detection devices 7, 7-1, 7-2, 8, 8-1, 8-2, and 9 described below. The single-photon detection device 1000 may include a SPAD. For convenience of explanation, the single-photon detection device 1 of FIG. 1 is overturned and illustrated as the single-photon detection device 1000.

The connection layer 2000 may include an insulating layer 2002 and wirings 2100. For example, the insulating layer 2002 may include silicon oxide (e.g., $SiO_2$), silicon nitride (e.g., SiN), silicon oxynitride (e.g., SiON), or a combination thereof.

The wirings 2100 may be connected to the first contact region 114 and the second contact region 122, and may apply a voltage. The wirings 2100 may electrically connect the second contact region 122 to the first depletion forming region 130, or may apply the same voltage. In an example, the wirings 2100 may be widely formed over the single-photon detection device 1000 and may improve efficiency by reflecting light. The wirings 2100 may connect the first contact region 114 and/or the second contact region 122 to a circuit 2202.

The control layer 2200 may include the circuit 2202. For example, the control layer 2200 may be a chip on which the circuit 2202 is formed. Although the circuit 2202 is shown as one block, it does not mean that the circuit 2202 includes only one electronic component (e.g., one transistor). The circuit 2202 may include various electronic components when necessary. When the single-photon detection device 1000 includes a SPAD, the circuit 2202 may include a quenching resistor or circuit and a readout circuit. The quenching circuit may stop an avalanche effect, and may enable the SPAD to detect another photon. Other pixel circuits may include a reset or recharge circuit, a memory, an amplification circuit, a counter, and a gate circuit, and may transmit signal current to the single-photon detection device 1000 or may receive signal current from the single-photon detection device 1000. Although the circuit 2202 is provided in the control layer 2200, the disclosure is not limited thereto. In another example, the circuit 2202 may be located on a semiconductor substrate on which the single-photon detection device 1000 is formed.

The lens unit 3000 may focus incident light and may transmit the light to the single-photon detection device 1000. For example, the lens unit 3000 may include a microlens and a Fresnel lens. In an example, a central axis of the lens unit 3000 may be aligned with a central axis of the single-photon detection device 1000. The central axis of the lens unit 3000 and the central axis of the single-photon detection device 1000 may imaginary axes that respectively pass through the center of the lens unit 3000 and the center of the single-photon detection device 1000 and are parallel to a direction in which the single-photon detection device 1000 and the lens unit 3000 is stacked. In an example, the central axis of the lens unit 3000 may be misaligned with the central axis of the single-photon detection device 1000. When the circuit 2202 is located on the semiconductor substrate on which the single-photon detection device 1000 is formed, assuming that a pixel isolation structure or a separation film (not shown) is used, the lens unit 3000 may be implemented to be larger than the single-photon detection device 1000. In an embodiment, the single-photon detector SE1 may further include a color filter, a bandpass filter, an anti-reflection coating, a two-dimensional (2D) nanomaterial, an organic material, etc. For example, a color filter, a bandpass filter, an anti-reflection coating, a two-dimensional (2D) nanomaterial, an organic material, etc. may be formed on the single-photon detection device 1000.

According to the disclosure, the single-photon detector SE1 having low noise may be provided.

Figure 19:
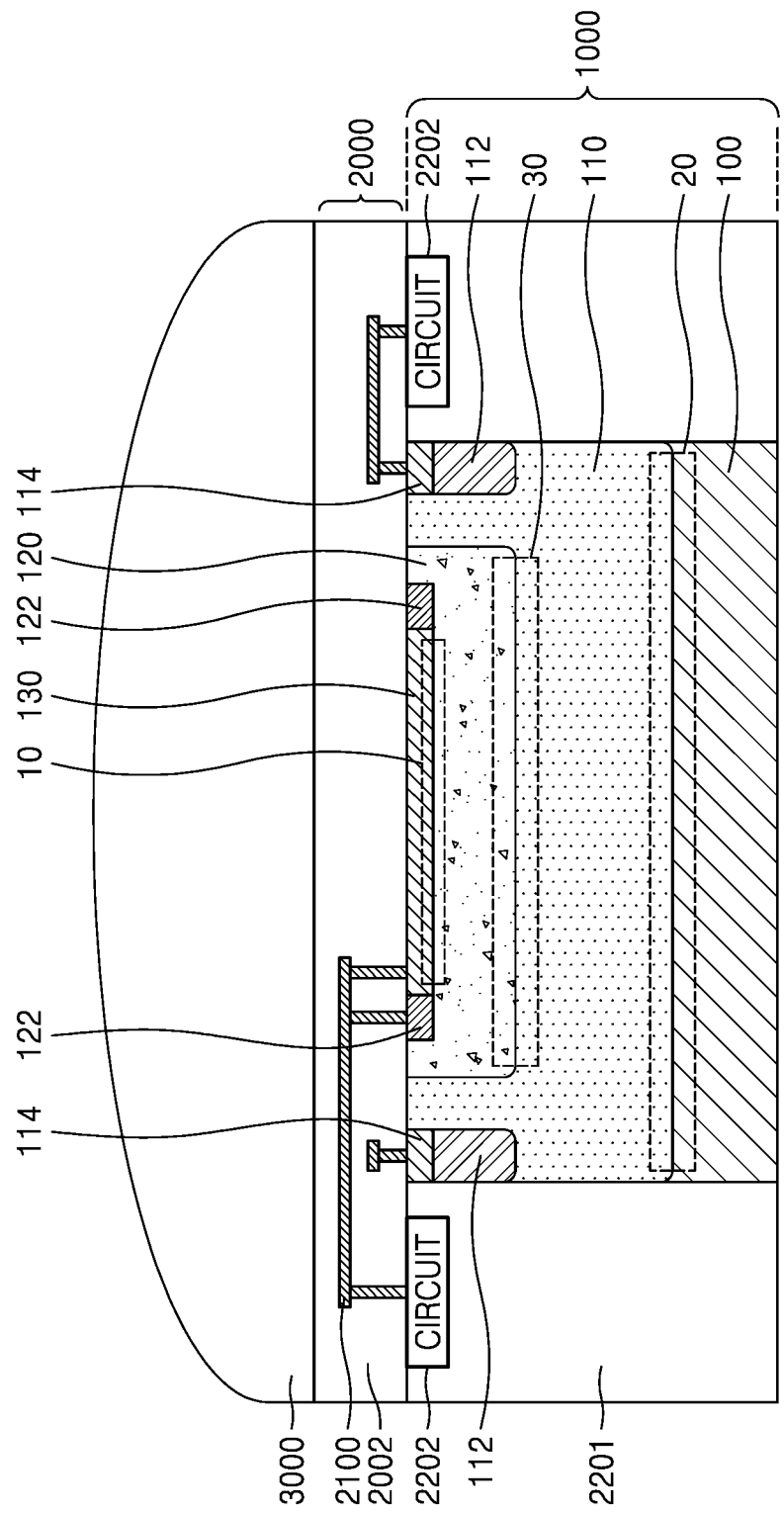
FIG. 19 is a cross-sectional view illustrating a single-photon detector, according to an embodiment.

FIG. 19 is a cross-sectional view illustrating a single-photon detector, according to an embodiment. For brevity of explanation, the same description as that made with reference to FIG. 18 will be omitted.

Referring to FIG. 19, a single-photon detector SE2 may be provided. The single-photon detector SE2 may be an image sensor using a frontside illumination (FSI) method. The single-photon detector SE2 may include the single-photon detection device 1000, the connection device 2000, a separation film SL, the circuit 2202, and the lens unit 3000. The single-photon detection device 1000 may be substantially the same as the single-photon detection device 1000 of FIG. 18.

The separation film SL may surround the single-photon detection device 1000. For example, the separation film SL may include silicon oxide, silicon nitride, silicon oxynitride, polycrystalline silicon, a low-k dielectric material, a metal, or a combination thereof.

The circuit 2202 may be located on a semiconductor substrate on which the single-photon detection device 1000 is formed. The circuit 2202 may be substantially the same as the circuit 2202 of FIG. 18.

The connection layer 2000 may be located or provided on the single-photon detection device 1000 and the separation film SL. The connection layer 2000 may include the insulating layer 2002 and the wirings 2100. The insulating layer 2002 and the wirings 2100 may be respectively substantially the same as the insulating layer 2002 and the wirings 2100 of FIG. 18.

The lens unit 3000 may be located or provided on the connection layer 2000. The lens unit 3000 may be substantially the same as the lens unit 3000 of FIG. 18.

In an embodiment, the single-photon detector SE2 may further include a color filter, a bandpass filter, an anti-reflection coating, a 2D nanomaterial, an organic material, etc. may be formed on the connection layer 2000 or the single-photon detection device 1000.

According to the disclosure, the single-photon detector SE2 having low noise may be provided.

Figure 20:
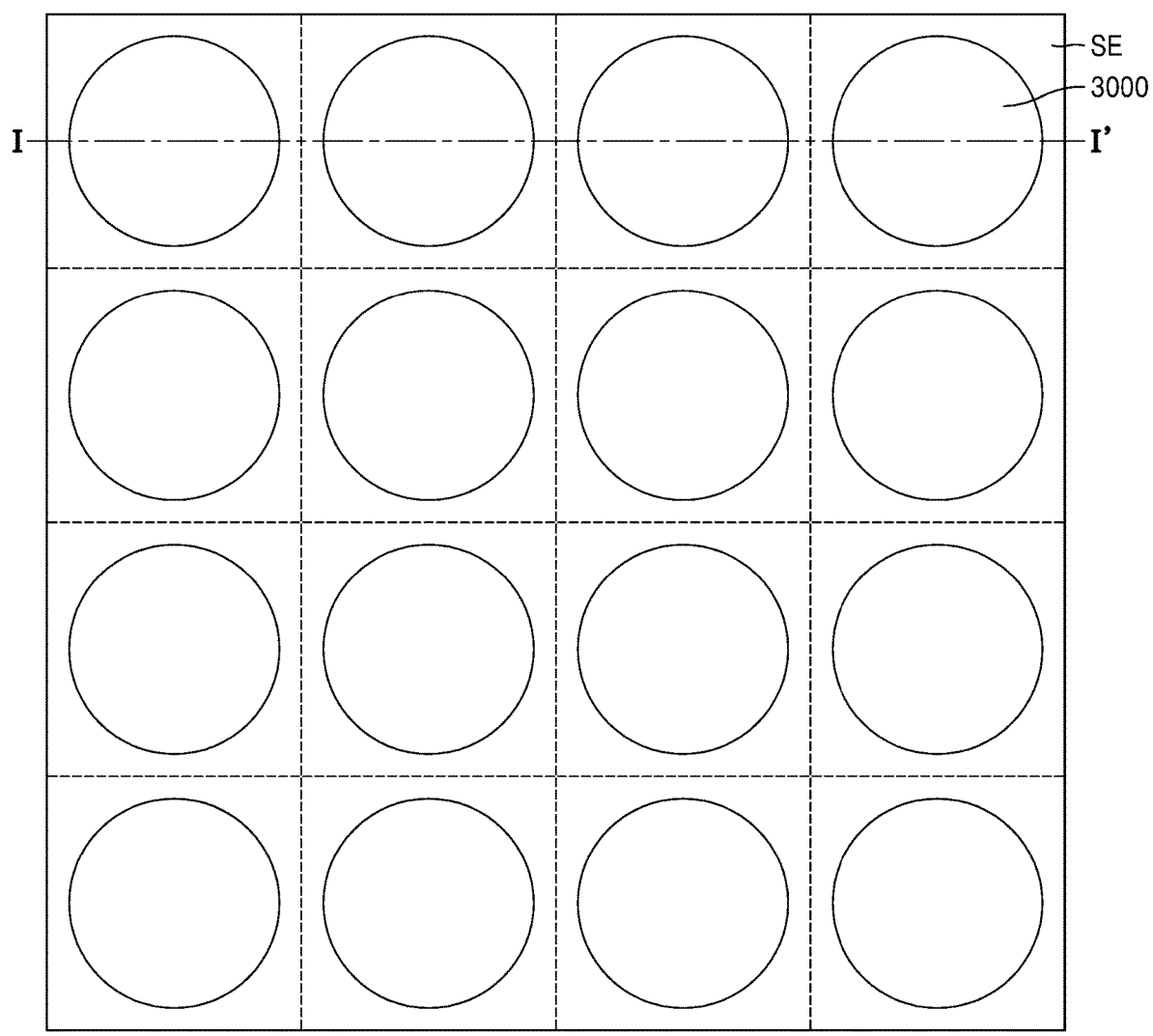
FIG. 20 is a plan view illustrating a single-photon detector array, according to an embodiment.
Figure 21:
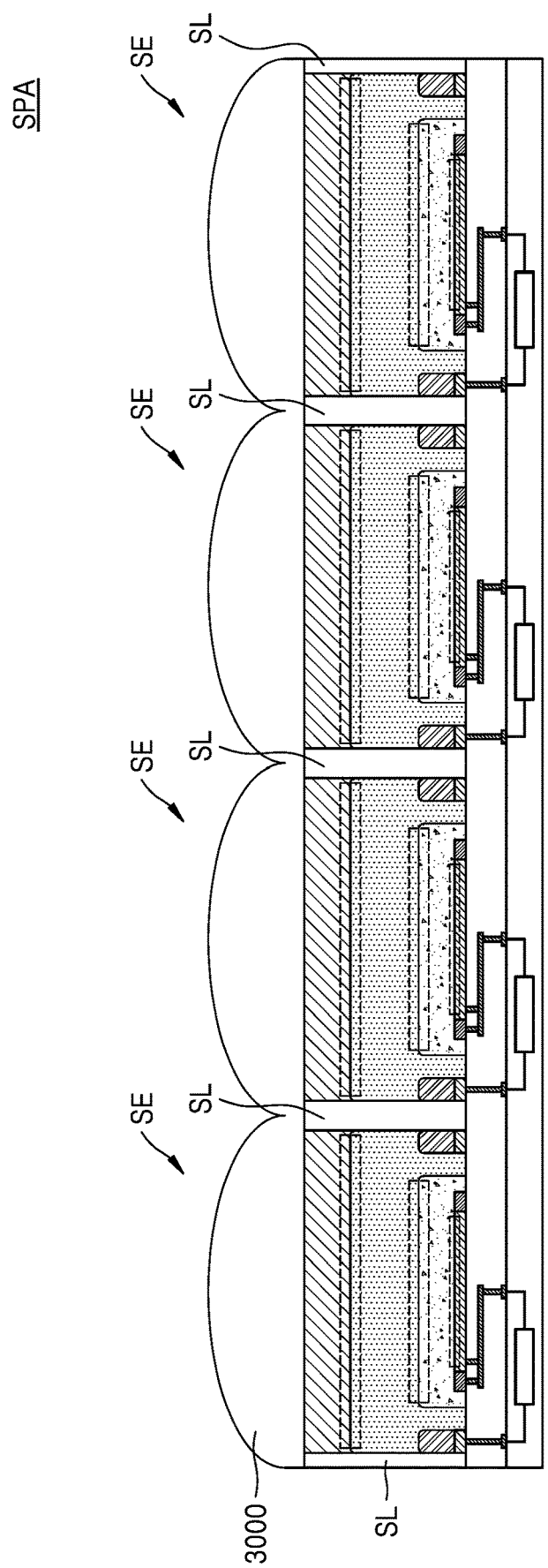
FIG. 21 is a cross-sectional view taken along line I-I' of FIG. 20.

FIG. 20 is a plan view illustrating a single-photon detector array, according to an embodiment. FIG. 21 is a cross-sectional view taken along line I-I' of FIG. 20. For brevity of explanation, the same description as that made with reference to FIG. 18 will be omitted.

Referring to FIGS. 20 and 21, a single-photon detector array SPA may be provided. The single-photon detector array SPA may include single-photon detectors SE that are two-dimensionally arranged. The single-photon detectors SE may respectively include the lens units 3000. The single-photon detectors SE may respectively define pixels. A boundary between the pixels in FIG. 20 is marked by a dashed line. Each of the single-photon detectors SE may be substantially the same as the single-photon detector SE1 of FIG. 18. However, this is not limited thereto, and each of the single-photon detectors SE may be substantially the same as the single-photon detector SE2 of FIG. 19.

The separation film SL may be located or provided between the single-photon detectors SE. The separation film SL may prevent crosstalk in which light incident on a pixel is detected in another pixel adjacent to the pixel. For example, the separation film SL may include silicon oxide, silicon nitride, silicon oxynitride, polycrystalline silicon, a low-k dielectric material, a metal, or a combination thereof.

According to the disclosure, the single-photon detector array SPA having low noise may be provided.

Figure 22:
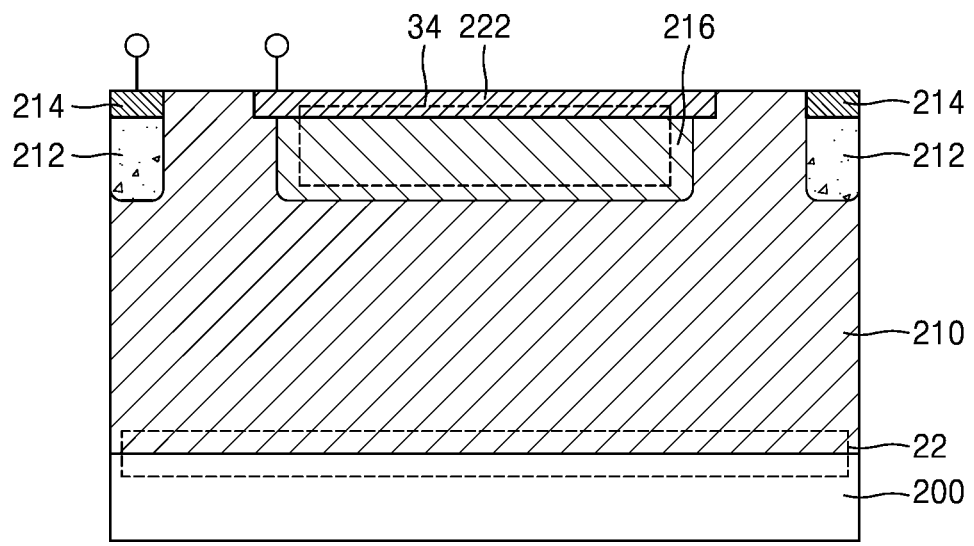
FIG. 22 is a cross-sectional view illustrating a single-photon detection device, according to an embodiment.

FIG. 22 is a cross-sectional view illustrating a single-photon detection device, according to an embodiment. For brevity of explanation, the same description as that made with reference to FIG. 15 will be omitted.

Referring to FIG. 22, a single-photon detection device 7 may be provided. The single-photon detection device 7 may include a SPAD. Unlike in FIG. 15, the single-photon detection device 7 may not include the third depletion forming region 230 (see FIG. 15) and the fourth well 220 (see FIG. 15). The fourth contact region 222, instead of the third depletion region, may be located or provided in a portion where the third depletion region is located or provided in FIG. 15.

The fifth well 216 may be located or provided under the fourth contact region 222. The fifth well 216 may directly contact the fourth contact region 222. The fifth well 216 may have a width less than that of the fourth contact region 222. A third main depletion region 34 may be formed in a portion adjacent to an interface between the fifth well 216 and the fourth contact region 222. When a reverse bias is applied to the single-photon detection device 7, a strong electric field may be applied to the third main depletion region 34. For example, a maximum intensity of the electric field may range from about $1 \times 10^5$ V/cm to about $1 \times 10^6$ V/cm. Because electrons may be multiplied by an electric field of the third main depletion region 34, the third main depletion region 34 may be referred to as a multiplication region.

The fourth sub-depletion region 22 may be formed in a portion adjacent to an interface between the fourth depletion forming region 200 and the third well 210. The fourth sub-depletion region 22 may reduce or substantially prevent electrons or holes other than electron-hole pairs generated by photons in the single-photon detection device 7 from being provided to the third main depletion region 34. For example, electrons or holes other than electron-hole pairs generated by photons in the single-photon detection device 7 may be generated due to surface defects of the single-photon detection device 7 adjacent to the fourth sub-depletion region 22. The fourth sub-depletion region 22 may reduce or substantially prevent the electrons or holes due to the surface defects of the single-photon detection device 7 from moving to the third main depletion region 34.

According to the disclosure, the single-photon detection device 7 having low noise may be provided.

Figure 23:
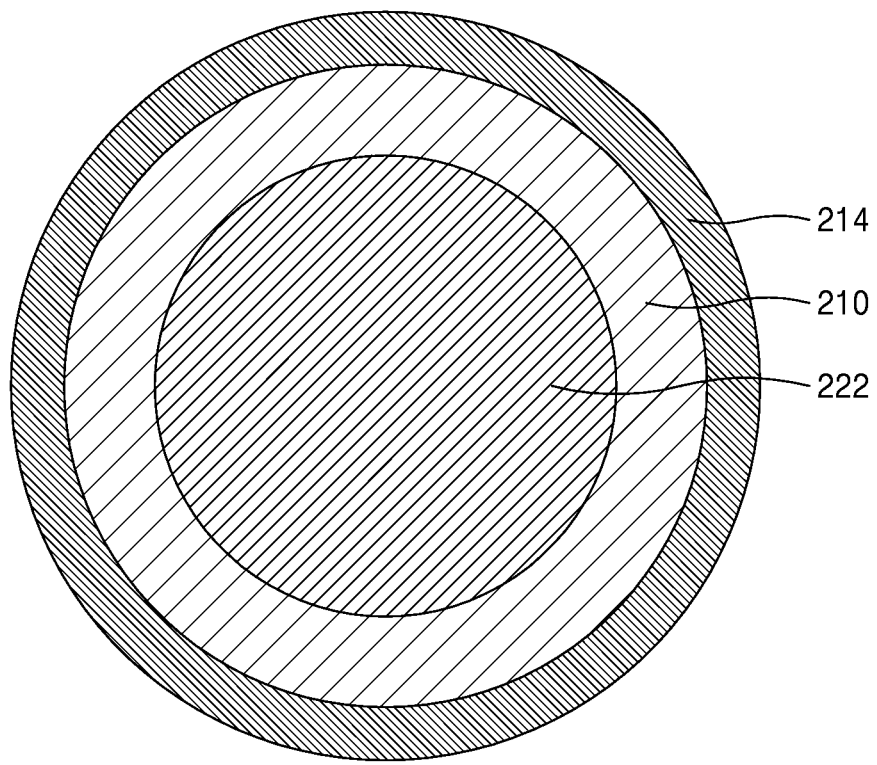
FIG. 23 is a plan view illustrating the single-photon detection device of FIG. 22, according to an embodiment.

FIG. 23 is a plan view illustrating the single-photon detection device of FIG. 22, according to an embodiment.

Referring to FIG. 23, the single-photon detection device 7 may have a circular shape. In detail, the fourth contact region 222 may have a circular shape, and the third well 210 and the third contact region 214 may each have a circular annular shape. The third well 210 and the third contact region 214 may surround the fourth contact region 222. For example, the fourth contact region 222, the third well 210, and the third contact region 214 may have the same center. The third well 210 and the third contact region 214 may be sequentially arranged away from the fourth contact region 222.

Although the single-photon detection device 7 has a circular shape, the disclosure is not limited thereto. In another example, as shown in FIGS. 3 through 8, the single-photon detection device 7 may have a square shape, an octagonal shape, a square shape with round corners, a rectangular shape, a rectangular shape with round corners, or an elliptical shape.

Figure 24:
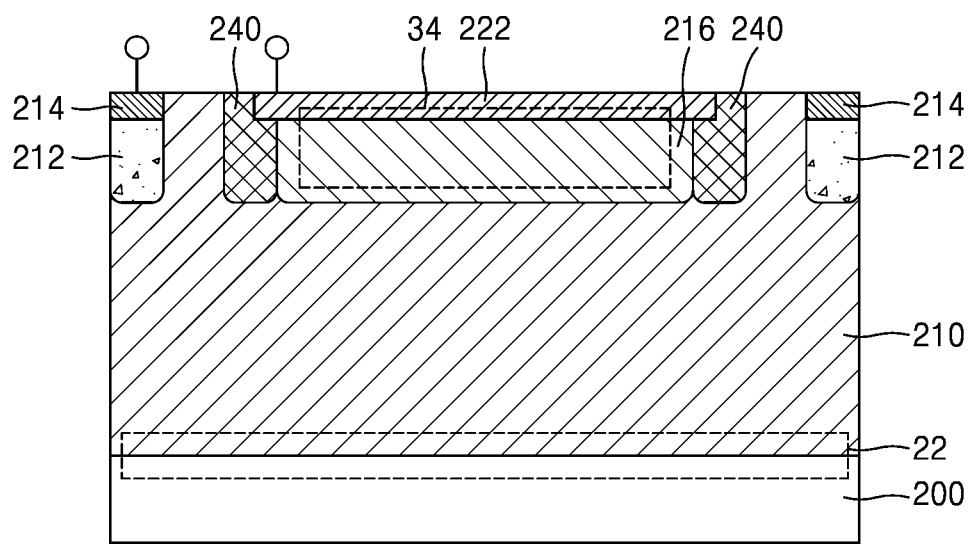
FIG. 24 is a cross-sectional view illustrating a single-photon detection device, according to an embodiment.

FIG. 24 is a cross-sectional view illustrating a single-photon detection device, according to an embodiment. For brevity of explanation, the same description as that made with reference to FIG. 22 will be omitted.

Referring to FIG. 24, a single-photon detection device 8 may be provided. The single-photon detection device 8 may include a SPAD. Referring to FIG. 22, the single-photon detection device 8 may further include a guard ring region 240.

The guard ring region 240 may be located or provided on a side surface of the fifth well 216. The guard ring region 240 may prevent premature breakdown by reducing the concentration of an electric field at an edge of the fifth well 216. Premature breakdown, which is a phenomenon where breakdown first occurs at an edge of the fifth well 216 before an electric field of a sufficient magnitude is applied to the third main depletion region 34, occurs as an electric field is concentrated at the edge of the fifth well 216. The guard ring region 240 may improve breakdown characteristics of the single-photon detection device 8. The guard ring region 240 may surround the fifth well 216. For example, the guard ring region 240 may have an annular shape extending along the side surface of the fifth well 216. The guard ring region 240 may directly contact the fifth well 216. The guard ring region 240 may be spaced apart from the third contact region 214 and the second relaxation region 212. However, this is merely an example. In another example, the guard ring region 240 may directly contact the third contact region 214 and the second relaxation region 212.

The third well 210 may extend to a portion between the guard ring region 240 and the second relaxation region 212 and a portion between the guard ring region 240 and the third contact region 214. For example, the portion between the guard ring region 240 and the second relaxation region 212 and the portion between the guard ring region 240 and the third contact region 214 may be filled with the third well 210. The guard ring region 240 may have the same conductivity type as that of the fourth contact region 222. A doping concentration of the guard ring region 240 may be lower than a doping concentration of the fourth contact region 222. For example, a doping concentration of the guard ring region 240 may range from about $1 \times 10^{15}$ cm$^{-3}$ to about $1 \times 10^{18}$ cm$^{-3}$.

According to the disclosure, the single-photon detection device 8 having low noise and improved breakdown characteristics may be provided.

Figure 25:
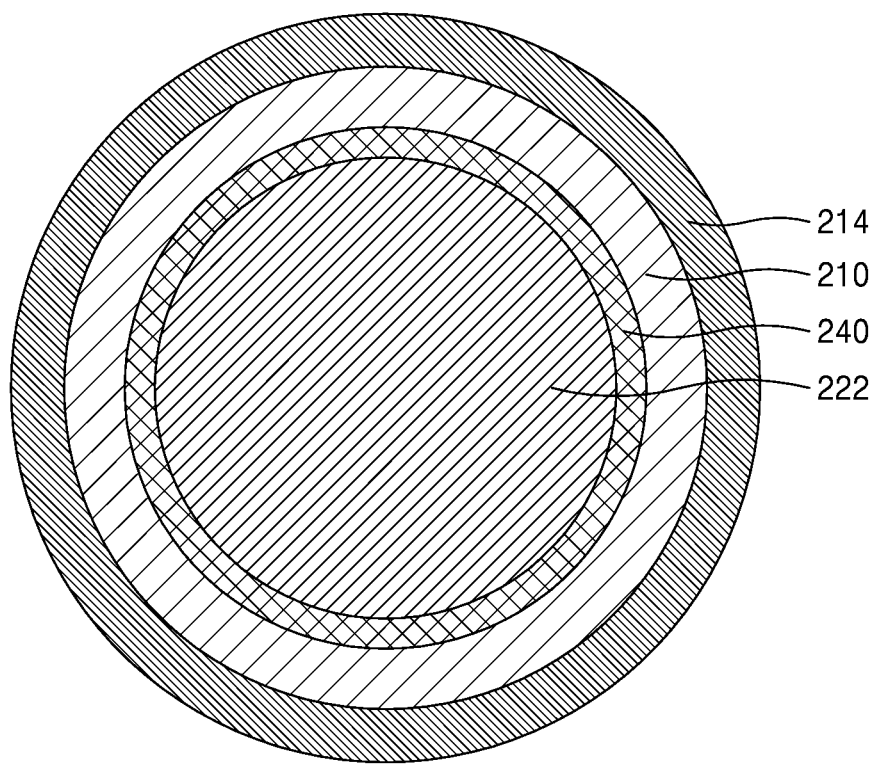
FIG. 25 is a plan view illustrating the single-photon detection device of FIG. 24, according to an embodiment.

FIG. 25 is a plan view illustrating the single-photon detection device of FIG. 24, according to an embodiment.

Referring to FIG. 25, the single-photon detection device 8 may have a circular shape. In detail, the fourth contact region 222 may have a circular shape, and the guard ring region 240, the third well 210, and the third contact region 214 may each have a circular annular shape. The guard ring region 240, the third well 210, and the third contact region 214 may surround the third depletion forming region 230. For example, the fourth contact region 222, the guard ring region 240, the third well 210, and the third contact region 214 may have the same center. The guard ring region 240, the third well 210, and the third contact region 214 may be sequentially arranged away from the fourth contact region 222.

Although the single-photon detection device 8 has a circular shape, the disclosure is not limited thereto. In another embodiment, as shown in FIGS. 3 through 8, the single-photon detection device 8 may have a square shape, an octagonal shape, a square shape with round corners, a rectangular shape, a rectangular shape with round corners, or an elliptical shape.

Figure 26:
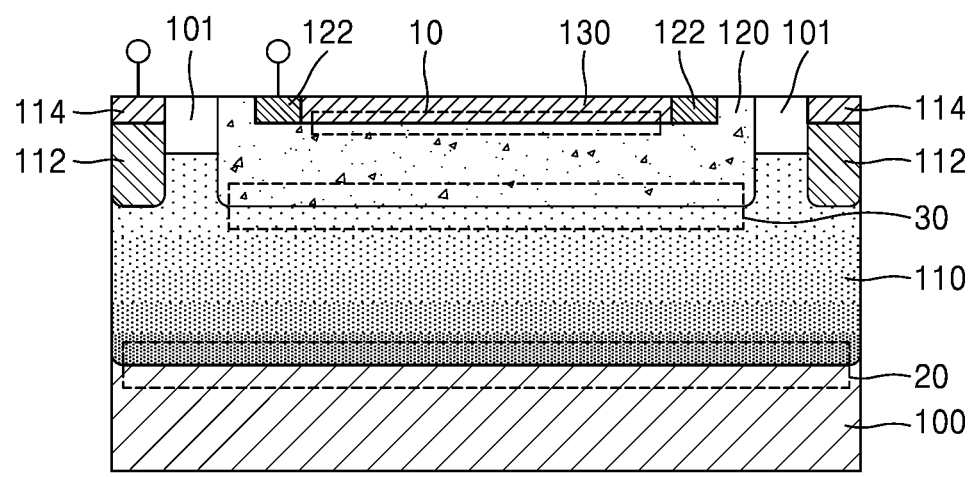
FIG. 26 is a cross-sectional view illustrating a single-photon detection device, according to an embodiment.

FIG. 26 is a cross-sectional view illustrating a single-photon detection device, according to an embodiment. For brevity of explanation, the same description as that made with reference to FIG. 1 will be omitted.

Referring to FIG. 26, a single-photon detection device 9 may be provided. The single-photon detection device 9 may include a SPAD. The single-photon detection device 9 may be substantially the same as the single-photon detection device 1 of FIG. 1, except for the first well 110 and a second conductivity-type region 101.

A doping concentration of the first well 110 may have a gradient. For example, a doping concentration of the first well 110 may decrease away from the second depletion forming region 100.

The second conductivity-type region 101 may be located or provided on the first well 110. Although the second conductivity-type region 101 is located or provided between the first relaxation region 112 and the second well 120 and between the first contact region 114 and the second well 120, the disclosure is not limited thereto. In another example, the second conductivity-type region 101 may be located or provided between the first contact region 114 and the second well 120, and may not be located or provided between the first relaxation region 112 and the second well 120.

The second conductivity-type region 101 may have the second conductivity type. When a conductivity type of the first well 110 is n-type, a conductivity type of the second conductivity-type region 101 may be p-type. When a conductivity type of the first well 110 is p-type, a conductivity type of the second conductivity-type region 101 may be n-type. The second conductivity-type region 101 may substantially have the same doping concentration as that of the second depletion forming region 100.

Figure 27:
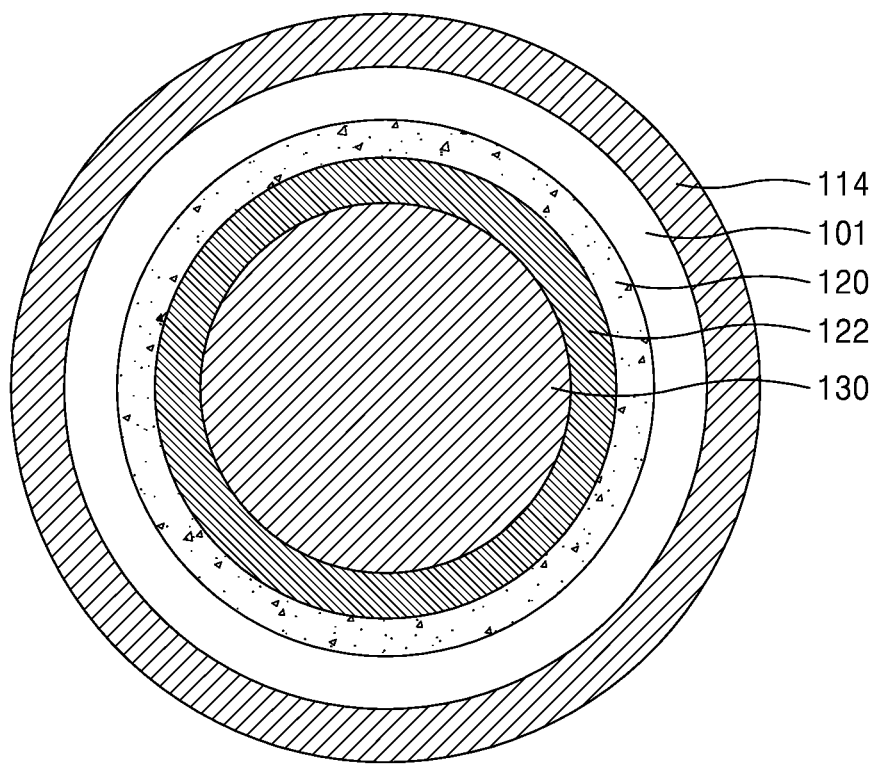
FIG. 27 is a plan view illustrating the single-photon detection device of FIG. 26, according to an embodiment.

FIG. 27 is a plan view illustrating the single-photon detection device of FIG. 26, according to an embodiment.

Referring to FIG. 27, the single-photon detection device 9 may have a circular shape. In detail, the first depletion forming region 130 may have a circular shape, and the second contact region 122, the second well 120, the first well 110, the second conductivity-type region 101, and the first contact region 114 may each have a circular annular shape. The second contact region 122, the second well 120, the first well 110, the second conductivity-type region 101, and the first contact region 114 may surround the first depletion forming region 130. For example, the first depletion forming region 130, the second contact region 122, the second well 120, the first well 110, the second conductivity-type region 101, and the first contact region 114 may have the same center. The second contact region 122, the second well 120, the first well 110, the second conductivity-type region 101, and the first contact region 114 may be sequentially arranged away from the first depletion forming region 130.

Although the single-photon detection device 9 has a circular shape, the disclosure is not limited thereto. In another example, as shown in FIGS. 3 through 8, the single-photon detection device 9 may have a square shape, an octagonal shape, a square shape with round corners, a rectangular shape, a rectangular shape with round corners, or an elliptical shape.

Figure 28:
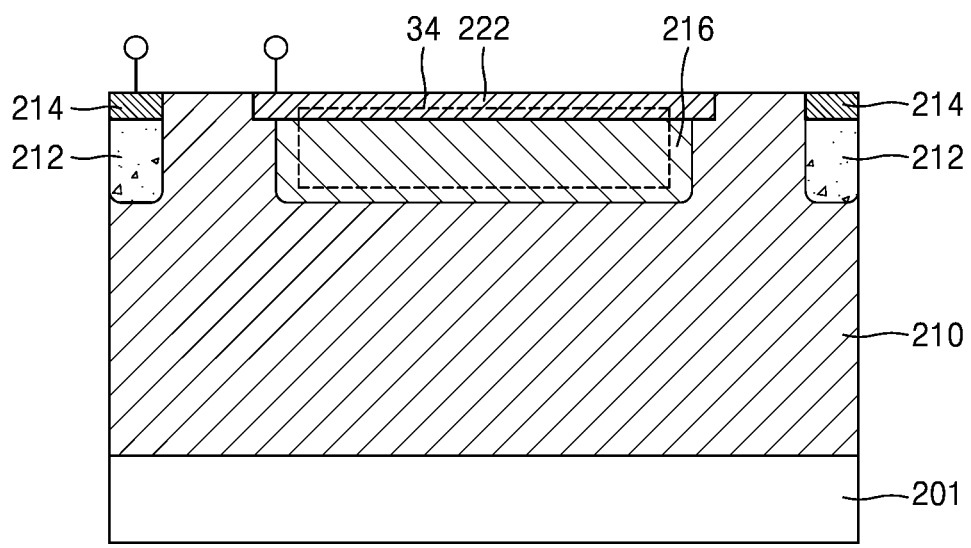
FIG. 28 is a cross-sectional view illustrating a single-photon detection device, according to an embodiment.

FIG. 28 is a cross-sectional view illustrating a single-photon detection device, according to an embodiment. For brevity of explanation, the same description as that made with reference to FIG. 22 will be omitted.

Referring to FIG. 28, a single-photon detection device 7-1 may be provided. The single-photon detection device 7-1 may include a SPAD. The single-photon detection device 7-1 may be substantially the same as the single-photon detection device 7 of FIG. 22, except that the single-photon detection device 7-1 includes a lower well 201 instead of the fourth depletion region 200 (see FIG. 22).

The lower well 201 may be located or provided under the third well 210. The lower well 201 may be located or provided opposite to the fifth well 216 with the third well 210 therebetween. The lower well 201 may be regions formed by doping a semiconductor substrate (e.g., a p-type or n-type silicon (Si) substrate). The lower well 201 may have the same conductivity type as that of the third well 210. The lower well 201 may have the first conductivity type. The lower well 201 may be doped at a higher concentration than that of the third well 210. For example, a doping concentration of the lower well 201 may range from about $1\times10^{15}$ cm$^{-3}$ to about $1\times10^{21}$ cm$^{-3}$.

The lower well 201 may reduce a magnitude of an electric field generated under the single-photon detection device 7-1. As a magnitude of an electric field generated under the single-photon detection device 7-1 decreases, a drift velocity of electrons or holes (hereinafter, noise carriers) generated due to defects on a bottom surface of the single-photon detection device 7-1 may decrease. As a drift velocity of noise carriers decreases, the influence of the noise carriers on the single-photon detection device 7-1 (e.g., a degree to which the noise carriers move to the third main depletion region 34) may decrease. Accordingly, the single-photon detection device 7-1 of the disclosure may have low noise.

Figure 29:
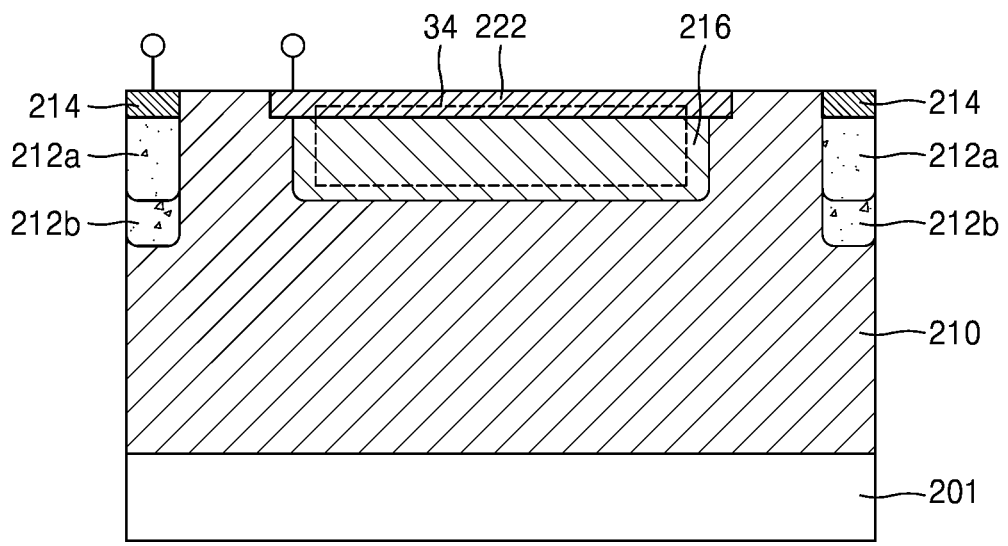
FIG. 29 is a cross-sectional view illustrating a single-photon detection device, according to an embodiment.

FIG. 29 is a cross-sectional view illustrating a single-photon detection device, according to an embodiment. For brevity of explanation, the same description as that made with reference to FIG. 28 will be omitted.

Referring to FIG. 29, a single-photon detection device 7-2 may be provided. The single-photon detection device 7-2 may include a SPAD. The single-photon detection device 7-2 may be substantially the same as the single-photon detection device 7-1 of FIG. 28, except that the single-photon detection device 7-2 includes a third relaxation region 212a and a fourth relaxation region 212b that is deeper than the third relaxation region 212a, instead of the second relaxation region 212.

The third relaxation region 212a may be located or provided under the third contact region 214. The third relaxation region 212a may directly contact the third contact region 214. The third relaxation region 212a may have the first conductivity type. A doping concentration of the third relaxation region 212a may be lower than a doping concentration of the first contact region 114, and may be higher than a doping concentration of the first well 110. For example, a doping concentration of the third relaxation region 212a may range from about $1\times10^{15}$ cm$^{-3}$ to about $1\times10^{19}$ cm$^{-3}$. In an embodiment, the third relaxation region 212a may be substantially the same as the second relaxation region 212 (see FIG. 28).

The fourth relaxation region 212b may be located or provided under the third relaxation region 212a. The fourth relaxation region 212b may contact the third relaxation region 212a. The fourth relaxation region 212b may have the first conductivity type. The fourth relaxation region 212b may have a similar doping concentration range to that of the third relaxation region 212a. For example, a doping concentration of the fourth relaxation region 212b may range from about $1\times10^{15}$ cm$^{-3}$ to about $1\times10^{19}$ cm$^{-3}$.

When the third relaxation region 212a and the fourth relaxation region 212b are used, a uniform bias voltage may be applied to the third well 210. When a plurality of single-photon detection devices 7-2 are located or disposed adjacent to one another, crosstalk between adjacent single-photon detection devices 7-2 may be prevented by the third relaxation region 212a and the fourth relaxation region 212b.

Figure 30:
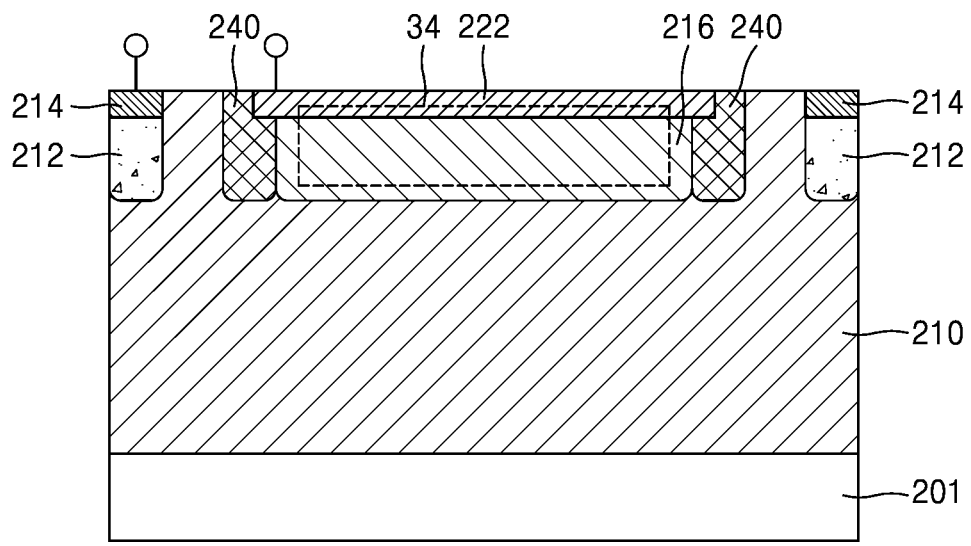
FIG. 30 is a cross-sectional view illustrating a single-photon detection device, according to an embodiment.

FIG. 30 is a cross-sectional view illustrating a single-photon detection device, according to an embodiment. For brevity of explanation, the same description as that made with reference to FIG. 24 will be omitted.

Referring to FIG. 30, a single-photon detection device 8-1 may be provided. The single-photon detection device 8-1 may include a SPAD. The single-photon detection device 8-1 may be substantially the same as the single-photon detection device 8 of FIG. 24, except that the single-photon detection device 8-1 includes the lower well 201 instead of the fourth depletion region 200 (see FIG. 24).

The lower well 201 may be located or provided under the third well 210. The lower well 201 may be located or provided opposite to the fifth well 216 with the third well 210 therebetween. The lower well 201 may be regions formed by doping a semiconductor substrate (e.g., a p-type or n-type silicon (Si) substrate). The lower well 201 may have the same conductivity type as that of the third well 210. The lower well 201 may have the first conductivity type. The lower well 201 may be doped at a higher concentration than that of the third well 210. For example, a doping concentration of the lower well 201 may range from about $1\times10^{15}$ cm$^{-3}$ to about $1\times10^{21}$ cm$^{-3}$.

The lower well 201 may reduce a magnitude of an electric field generated under the single-photon detection device 8-1. As a magnitude of an electric field generated under the single-photon detection device 8-1 decreases, a drift velocity of electrons or holes (hereinafter, noise carriers) generated due to defects on a bottom surface of the single-photon detection device 8-1 may decrease. As a drift velocity of noise carriers decreases, the influence of the noise carriers on the single-photon detection device 8-1 (e.g., a degree to which the noise carriers move to the third main depletion region 34) may decrease. Accordingly, the single-photon detection device 8-1 of the disclosure may have low noise.

Figure 31:
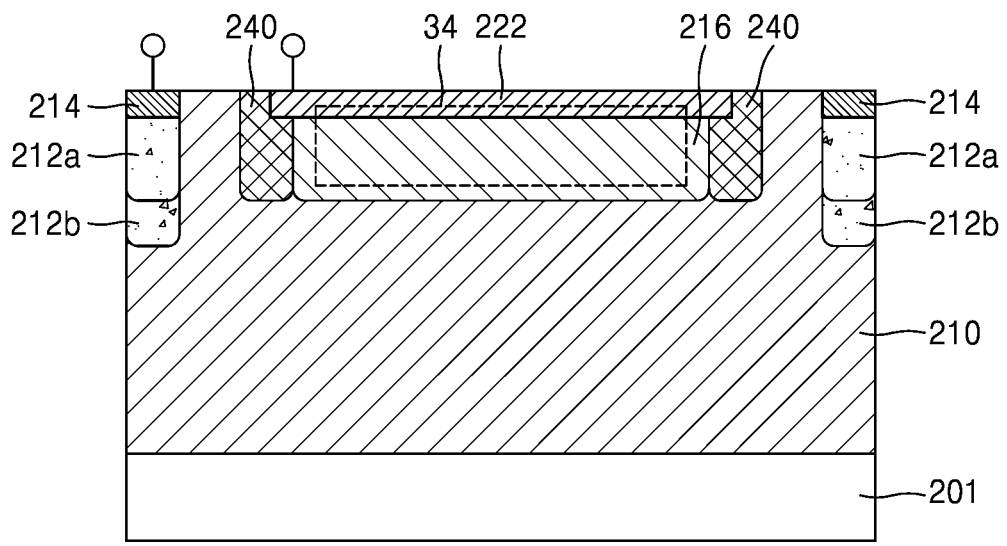
FIG. 31 is a cross-sectional view illustrating a single-photon detection device, according to an embodiment.

FIG. 31 is a cross-sectional view illustrating a single-photon detection device, according to an embodiment. For brevity of explanation, the same description as that made with reference to FIG. 30 will be omitted.

Referring to FIG. 31, a single-photon detection device 8-2 may be provided. The single-photon detection device 8-2 may include a SPAD. The single-photon detection device 8-2 may be substantially the same as the single-photon detection device 8-1 of FIG. 30, except that the single-photon detection device 8-2 includes the relaxation region 212a and the relaxation region 212b that is deeper than the third relaxation region 212a, instead of the second relaxation region 212.

The third relaxation region 212a may be located or provided under the third contact region 214. The third relaxation region 212a may directly contact the third contact region 214. The third relaxation region 212a may have the first conductivity type. A doping concentration of the third relaxation region 212a may be lower than a doping concentration of the first contact region 114, and may be higher than a doping concentration of the first well 110. For example, a doping concentration of the third relaxation region 212a may range from about $1\times10^{15}$ cm$^{-3}$ to about $1\times10^{19}$ cm$^{-3}$. In an example, the third relaxation region 212a may be substantially the same as the second relaxation region 212 (see FIG. 30).

The fourth relaxation region 212b may be located or provided under the third relaxation region 212a. The fourth relaxation region 212b may contact the third relaxation region 212a. The fourth relaxation region 212b may have the first conductivity type. The fourth relaxation region 212b may have a similar doping concentration range to that of the third relaxation region 212a. For example, a doping concentration of the fourth relaxation region 212b may range from about $1\times10^{15}$ cm$^{-3}$ to about $1\times10^{19}$ cm$^{-3}$.

When the third relaxation region 212a and the fourth relaxation region 212b are used, a uniform bias voltage may be applied to the third well 210. When a plurality of single-photon detection devices 8-2 are located or disposed adjacent to one another, crosstalk between adjacent single-photon detection devices 8-2 may be prevented by the third relaxation region 212a and the fourth relaxation region 212b.

Figure 32:
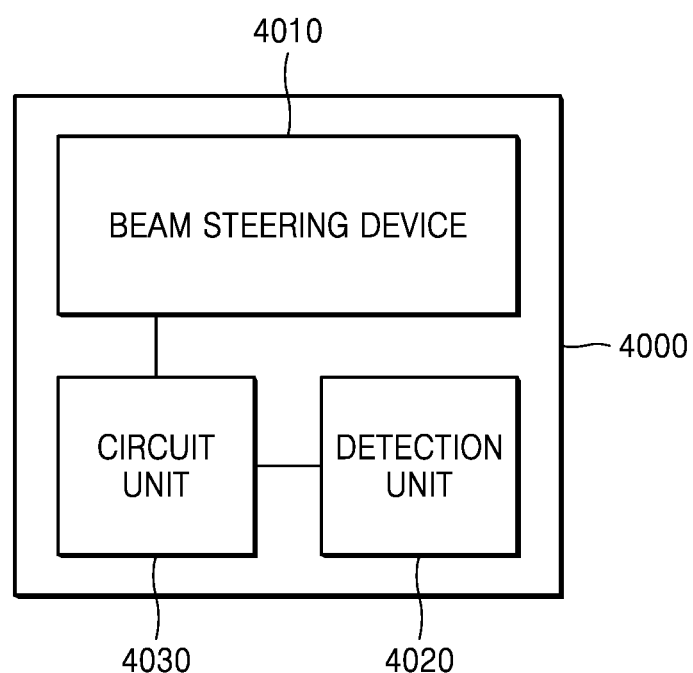
FIG. 32 is a block diagram for describing an electronic device, according to an embodiment.

FIG. 32 is a block diagram for describing an electronic device, according to an embodiment.

Referring to FIG. 32, an electronic device 4000 may be provided. The electronic device 4000 may emit light to an object (not shown), and may detect light reflected from the object to the electronic device 4000. The electronic device 4000 may include a beam steering device 4010. The beam steering device 4010 may adjust a direction of light emitted to the outside of the electronic device 4000. The beam steering device 4010 may be a mechanical or non-mechanical (semiconductor type) beam steering device. The electronic device 4000 may include a light source unit in the beam steering device 4010, or may include a light source unit located outside the beam steering device 4010. The beam steering device 4010 may be a light-emitting device using a scanning method. However, the light-emitting device of the electronic device 4000 is not limited to the beam steering device 4010. In another example, the electronic device 4000 may include a light-emitting device using a flash method, instead of or along with the beam steering device 4010. The light-emitting device using the flash method may emit light to an area including all fields of view at once without a scanning process.

Light steered by the beam steering device 4010 may be reflected by the object to the electronic device 4000. The electronic device 4000 may include a detection unit 4020 for detecting light reflected by the object. The detection unit 4020 may include a plurality of light detection elements, and may further include other optical members. The plurality of light detection elements may include any one of the single-photon detection devices 1, 2, 3, 4, 5, 6, 7, 7-1, 7-2, 8, 8-1, 8-2, and 9 described above. Also, the electronic device 4000 may further include a circuit unit 4030 connected to at least one of the beam steering device 4010 and the detection unit 4020. The circuit unit 4030 may include a calculation unit that obtains and calculates data, and may further include a driver and a controller. Also, the circuit unit 4030 may further include a power supply unit and a memory.

Although the electronic device 4000 includes the beam steering device 4010 and the detection unit 4020 in one device, the beam steering device 4010 and the detection unit 4020 may not be provided in one device but may be provided in separate devices. Also, the circuit unit 4030 may be connected to the beam steering device 4010 or the detection unit 4020 through wireless communication rather than wired communication.

The electronic device 4000 according to the above embodiment may be applied to various electronic devices. For example, the electronic device 4000 may be applied to a light detection and ranging (LiDAR) device. The LiDAR device may be a phase-shift type or time-of-flight (TOF) type device. Also, any of the single-photon detection devices 1, 2, 3, 4, 5, 6, 7, 7-1, 7-2, 8, 8-1, 8-2, and 9 or the electronic device 4000 including the same according to an embodiment may be mounted on an electric device such as a smartphone, a wearable device (e.g., augmented reality (AR) and virtual reality (VR) glasses), an Internet of things (IoT) device, a home appliance, a tablet personal computer (PC), a personal digital assistant (PDA), a portable multimedia player (PMP), a navigation device, a drone, a robot, a self-driving vehicle, an autonomous vehicle, or an advanced driver-assistance system (ADAS).

Figure 33:
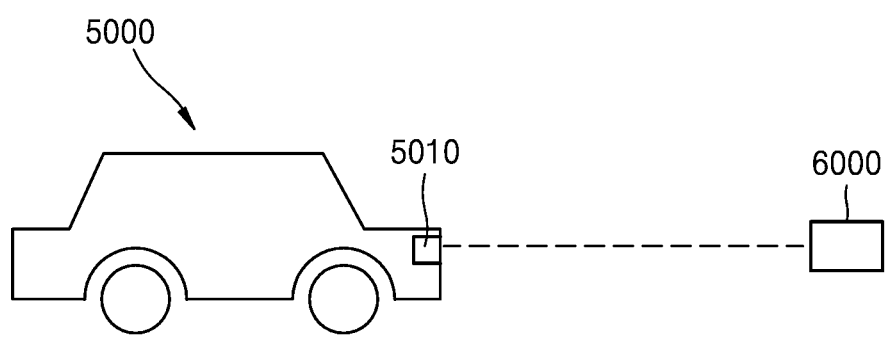
FIGS. 33 and 34 are conceptual views illustrating a case where a light detection and ranging (LiDAR) device is applied to a vehicle, according to an embodiment.
Figure 34:
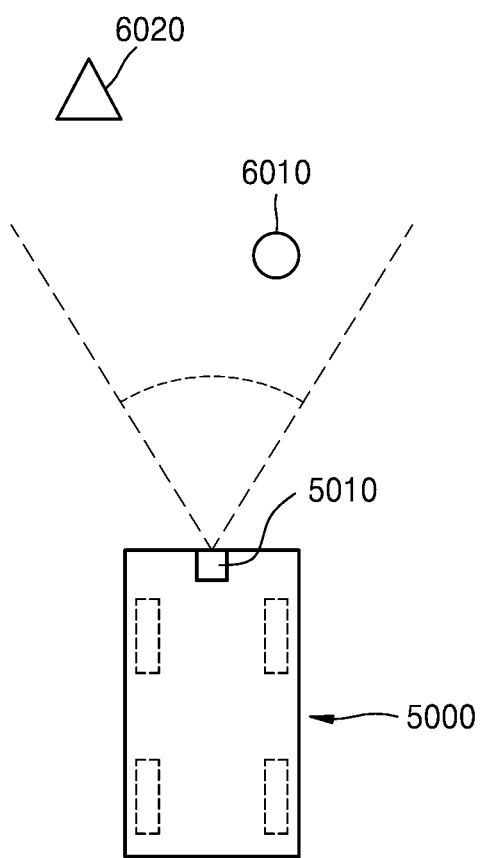

FIGS. 33 and 34 are conceptual views illustrating a case where a LiDAR device is applied to a vehicle, according to an embodiment.

Referring to FIGS. 33 and 34, a LiDAR device 5010 may be applied to a vehicle 5000, and information about an object 6000 may be obtained by using the LiDAR device 5010. The vehicle 5000 may be an autonomous vehicle. The LiDAR device 5010 may detect a solid body or a person, that is, the object 6000, in a direction in which the vehicle 5000 travels. The LiDAR device 5010 may measure a distance to the object 6000, by using information such as a time difference between a transmitted signal and a detected signal. The LiDAR device 5010 may obtain information about a near object 6010 and a far object 6020 within a scan range. The LiDAR device 5010 may include the electronic device 4000 of FIG. 32.

Although the LiDAR device 5010 is located or disposed on a front portion of the vehicle 5000 and detects the object 6000 in a direction in which the vehicle 5000 travels, the disclosure is not limited thereto. In another example, the LiDAR device 5010 may be located or disposed at a plurality of locations on the vehicle 5000 to detect all objects 6000 around the vehicle 5000. For example, four LiDAR devices 5010 may be located or disposed on a front portion, a rear portion, and left and right portions of the vehicle 5000. In another example, the LiDAR device 5010 may be located or disposed on a roof of the vehicle 5000, and may rotate and detect all objects 6000 around the vehicle 5000.

According to the disclosure, a photo-detection device having low noise may be provided.

According to the disclosure, a photodetector having low noise may be provided.

However, effects of the disclosure are not limited thereto.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the disclosure as defined by the following claims.

What is claimed is:
1. A single-photon detection device comprising:
   a first well having a first conductivity type;
   a second well provided on the first well and having a second conductivity type that is different from the first conductivity type;
   a first depletion forming region provided on the second well and having the first conductivity type;
   a main depletion region provided between the first well and the second well as an avalanche multiplication region; and
   a first sub-depletion region provided between the second well and the first depletion forming region,
   wherein the first well and the first depletion forming region are spaced apart from each other so that the first depletion forming region does not directly contact the first well.

2. The single-photon detection device of claim 1, further comprising:
a second depletion forming region provided opposite to the second well with the first well therebetween; and
a second sub-depletion region provided between the second depletion forming region and the first well,
wherein the second depletion forming region has the second conductivity type.

3. The single-photon detection device of claim 1, further comprising a first contact region electrically connected to the first well,
wherein the first contact region is spaced apart from the second well and has the first conductivity type,
wherein a doping concentration of the first contact region is higher than a doping concentration of the first well.

4. The single-photon detection device of claim 3, further comprising a relaxation region provided between the first contact region and the first well, wherein the relaxation region has the first conductivity type,
wherein a doping concentration of the relaxation region is lower than a doping concentration of the first contact region.

5. The single-photon detection device of claim 1, further comprising a second contact region electrically connected to the second well,
wherein the second contact region has the second conductivity type,
wherein a doping concentration of the second contact region is higher than a doping concentration of the second well.

6. The single-photon detection device of claim 5, wherein the second contact region and the first depletion forming region contact each other.

7. The single-photon detection device of claim 5, wherein the second contact region and the first depletion forming region are spaced apart from each other.

8. The single-photon detection device of claim 1, further comprising a guard ring region provided on a side surface of the second well,
wherein the guard ring region has the second conductivity type.

9. The single-photon detection device of claim 8, wherein the guard ring region surrounds the second well.

10. The single-photon detection device of claim 1, wherein the first well extends from a bottom surface of the second well to a side surface of the second well.

11. The single-photon detection device of claim 1, further comprising a third well surrounding the first well and the second well,
wherein the third well has the first conductivity type.

12. The single-photon detection device of claim 11, further comprising:
a second depletion forming region provided opposite to the first well with the third well therebetween; and
a third sub-depletion region provided between the second depletion forming region and the third well,
wherein the second depletion forming region has the second conductivity type.

13. The single-photon detection device of claim 11, further comprising a third contact region provided on the third well and spaced apart from the second well, wherein the third contact region has the first conductivity type.

14. The single-photon detection device of claim 11, wherein a doping concentration of the third well is lower than a doping concentration of the first well.

15. The single-photon detection device of claim 11, wherein the third well contacts a side surface of the second well.

16. A single-photon detector comprising:
a single-photon detection device configured to generate an electrical signal by receiving light;
a control layer configured to process the electrical signal; and
a lens unit configured to receive the light from outside and focus the light on the single-photon detection device,
wherein the single-photon detection device comprises a first well having a first conductivity type, a second well provided on the first well and having a second conductivity type that is different from the first conductivity type, a first depletion forming region provided on the second well and having the first conductivity type, a main depletion region provided between the first well and the second well as an avalanche multiplication region, and a first sub-depletion region provided between the second well and the first depletion forming region,
wherein the first well and the first depletion forming region are spaced apart from each other so that the first depletion forming region does not directly contact the first well.

17. The single-photon detector of claim 16, wherein the control layer is disposed between the single-photon detection device and the lens unit.

18. The single-photon detector of claim 16, wherein the single-photon detection device is disposed between the control layer and the lens unit.

19. The single-photon detector of claim 16, wherein the first depletion forming region is disposed closer to the control layer than the lens unit.

20. The single-photon detector of claim 16, wherein the control layer comprises:
an insulating layer;
wirings; and
circuits,
wherein the wirings electrically connect the first well and the second well to the circuits, and
the circuits comprise a quenching circuit and a readout circuit.

21. The single-photon detector of claim 20, wherein the circuits further comprise at least one of a recharge circuit, a memory, an amplification circuit, a counter, and a gate circuit.

22. The single-photon detector of claim 16, wherein the single-photon detector comprises at least one of a color filter, a bandpass filter, an anti-reflection coating, a two-dimensional (2D) nanomaterial, and an organic material provided on the single-photon detection device.

23. A single-photon detector array comprising:
a plurality of single-photon detection devices configured to generate an electrical signal by receiving light;
a control layer configured to process the electrical signal; and
a plurality of lenses configured to receive the light from outside and respectively focus the light on the plurality of single-photon detection devices,
wherein each of the plurality of single-photon detection devices comprises a first well having a first conductivity type, a second well provided on the first well and having a second conductivity type that is different from the first conductivity type, a first depletion forming region provided on the second well and having the first conductivity type, a main depletion region provided between the first well and the second well as an avalanche multiplication region, and a first sub-depletion region provided between the second well and the first depletion forming region,
wherein the first well and the first depletion forming region are spaced apart from each other so that the first depletion forming region does not directly contact the first well.

* * * * *